(12) United States Patent
Pohlack et al.

(10) Patent No.: US 9,106,257 B1
(45) Date of Patent: Aug. 11, 2015

(54) CHECKSUMMING ENCAPSULATED NETWORK PACKETS

(71) Applicant: Amazon Technologies, Inc., Reno, NV (US)

(72) Inventors: Martin Thomas Pohlack, Dresden (DE); Eric Jason Brandwine, Haymarket, VA (US); Matthew Shawn Wilson, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 224 days.

(21) Appl. No.: 13/927,913

(22) Filed: Jun. 26, 2013

(51) Int. Cl.
*G06F 11/10* (2006.01)
*H03M 13/00* (2006.01)
*H03M 13/09* (2006.01)

(52) U.S. Cl.
CPC ...................................... *H03M 13/09* (2013.01)

(58) Field of Classification Search
CPC ....................................................... H03M 13/09
See application file for complete search history.

(56) References Cited

U.S. PATENT DOCUMENTS

| | | | |
|---|---|---|---|
| 2004/0218623 | A1 | 11/2004 | Goldenberg et al. |
| 2009/0161568 | A1* | 6/2009 | Kastner .......................... 370/252 |
| 2011/0261812 | A1 | 10/2011 | Kini et al. |
| 2011/0314274 | A1 | 12/2011 | Swartz |
| 2012/0250682 | A1 | 10/2012 | Vincent et al. |
| 2012/0250686 | A1 | 10/2012 | Vincent et al. |

OTHER PUBLICATIONS

"Internetworking Technology Handbook" Cisco DocWiki http://docwiki.cisco.com/wikiInternetworking_Technology_Handbook downloaded Jun. 26, 2013 Selected Sections, pp. 1-54.
Data Encapsulation and the TCP/IP Protocol Stack (Oracle System Administration Guide, vol. 3) © 2010, Oracle Corporation and/or its affiliates, downloaded Jun. 26, 2013 pp. 1-3.
U.S. Appl. No. 13/069,727, filed Mar. 23, 2011, Eric J. Brandwine et al.
U.S. Appl. No. 13/069,719, filed Mar. 23, 2011, Eric J. Brandwine et al.

* cited by examiner

*Primary Examiner* — Sam Rizk
(74) *Attorney, Agent, or Firm* — Robert C. Kowert; Meyertons, Hood, Kivlin, Kowert & Goetzel, P.C.

(57) ABSTRACT

Methods and apparatus for checksumming network packets encapsulated according to an encapsulation protocol are described in which a single checksum is performed at the encapsulation layer, with checksum generation performed at the source encapsulation layer and checksum validation performed at the destination encapsulation layer. The packet source and packet destination may be informed by the encapsulation layer that a checksum operation is not necessary for the network packets. By performing checksumming at the encapsulation layer, the method may reduce overhead as checksum computation is initiated once rather than twice as in conventional encapsulation techniques. In addition, checksum algorithms may be used that provide stronger error detection or correction than is provided by standard network protocol checksumming, different checksum algorithms may be selected for different paths according to one or more criteria, and checksum operations may be offloaded to hardware.

20 Claims, 16 Drawing Sheets

CHECKSUMMING ENCAPSULATED NETWORK PACKETS

BACKGROUND

Checksum techniques are used for detecting errors in transmitted packets. In a checksum technique, a checksum function or algorithm is applied to a packet prior to transmission, and the resulting checksum value is stored in a field of the packet as packet metadata. At the packet destination, the same checksum algorithm may be applied to the packet, and the resulting checksum value is compared to the checksum value stored in the packet. If the two values are the same, then it is likely that the packet was not accidentally altered during transmission. If the two values differ, then at least one error has been introduced into the packet during transmission.

There are several different checksum algorithms that vary according to their ability to detect errors from relatively weak error detection that can only detect some types of errors to relatively strong error detection (e.g., 32-bit cyclic redundancy code (CRC32)) that can detect more complex errors or even maliciously introduced errors. In addition to detecting errors, some checksum techniques employ checksum algorithms that generate checksums that allow at least some detected errors to be corrected at the destination, for example error-correcting codes such as Reed-Solomon codes and erasure codes produced by erasure coding techniques, thus avoiding the need to retransmit the packets.

Figure 1A:
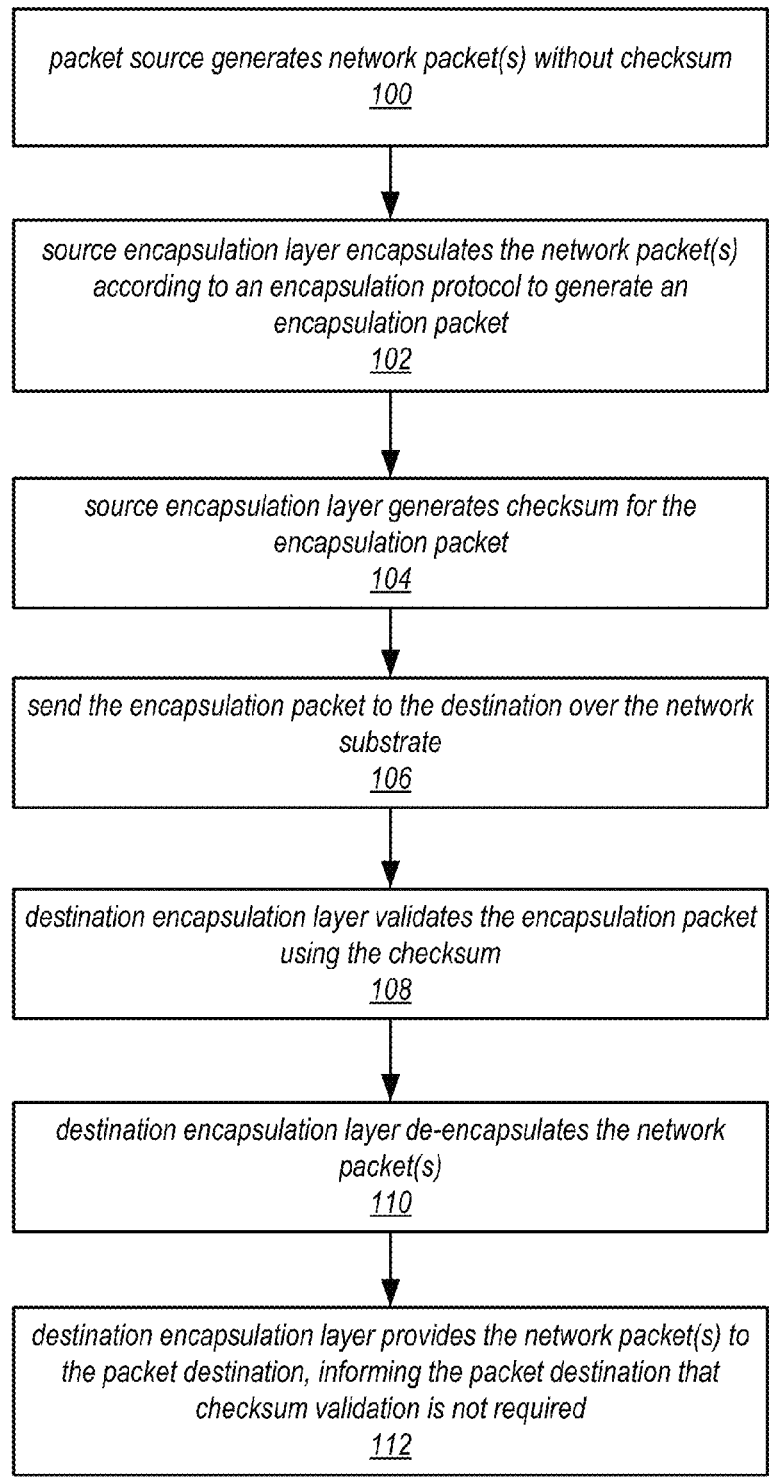
FIG. 1A is a high-level flowchart of an encapsulation protocol checksum method, according to at least some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION

Various embodiments of methods and apparatus for checksumming network packets encapsulated according to an encapsulation protocol are described. In encapsulation protocol technology, network packets may be generated by a network packet source (an entity that generates the network packets), wrapped or encapsulated at an encapsulation layer according to an encapsulation protocol to produce encapsulation protocol packets (also referred to herein as encapsulation packets or network substrate packets). The encapsulation packets are then routed over a network or network substrate to a destination according to routing information for the encapsulation packets. At the destination, an encapsulation layer removes the network packets from the encapsulation packets and provides or sends the network packets to the network packet destination (an entity that consumes the network packets).

Each encapsulation packet may include one, two, or more network packets. In various embodiments, the encapsulation protocol may be a standard network protocol such as IPv6 or UDP, or alternatively may be a non-standard, custom, or proprietary network protocol.

The network packets that are encapsulated according to the encapsulation protocol may, for example, be Internet Protocol (IP) technology packets including but not limited to IPv4 (Internet Protocol version 4) packets, IPv6 (Internet Protocol version 6) packets, Transmission Control Protocol (TCP) packets, User Datagram Protocol (UDP) packets, or Internet Control Message Protocol (ICMP) packets. However, the network packets may be packets according to other IP protocols, other standard protocols than IP protocols, or packets according to other non-standard, custom, or proprietary protocols.

In addition, a network packet that is encapsulated according to the encapsulation protocol may include one, two or more network protocol layers, for example according to the Open Systems Interconnection (OSI) model. As an example, a network packet that is received at the encapsulation layer from a packet source may be a Layer 4 (transport layer) packet (e.g., a TCP or UDP packet) that includes a Layer 5 payload, or a Layer 3 (network layer) packet (e.g., IPv4 or IPv6) that includes a Layer 4 packet as a payload. Note that each network protocol layer may add metadata (e.g., a header and/or footer) to the network packet. Thus, a network packet as used herein may include one, two, or more headers and/or footers according to network protocols used at the layer(s). The encapsulation layer adds additional metadata (e.g., an encapsulation header and/or footer) to the network packet according to the encapsulation protocol.

Note that many network protocols include a checksum field in the network protocol metadata, and the published standards or specifications of many network protocols (e.g., the Request for Comments (RFC) publications of the Internet Engineering Task Force (IETF) and the Internet Society) require that the checksum field be filled in by the sender in order to be compliant with the standards.

In conventional packet encapsulation techniques, checksumming of the network packets may typically be performed according to a standard network protocol checksum mechanism at the network packet source (checksum generation) prior to passing the network packets to the encapsulation layer, and at the network packet destination (checksum validation) after receiving the network packets from the encapsulation layer. As an example of a standard network protocol checksum mechanism, TCP includes a 16-bit checksum field in the TCP packet header and specifies a TCP checksum algorithm. Similarly, UDP includes a 16-bit checksum field in the UDP header and specifies a checksum algorithm. These standard network protocol checksum mechanisms may provide a moderate level of error detection, but do not provide error correction. In at least some conventional packet encapsulation techniques, the encapsulation layer at the source and destination may also perform a separate checksumming of the encapsulation protocol metadata (e.g., the encapsulation header and/or footer) in which the network packets are wrapped.

In embodiments of the methods and apparatus for checksumming network packets encapsulated according to an encapsulation protocol as described herein, rather than performing separate checksumming of the network packets at the packet source and packet destination and of the encapsulation protocol metadata at the encapsulation layer, a single checksum operation is performed for the encapsulation packet at the encapsulation layer of the source and destination, with checksum generation being performed at the source encapsulation layer and checksum validation being performed at the destination encapsulation layer. The network packet source and network packet destination may be informed by the encapsulation layer that a checksum operation is not necessary for the network packets. For simplicity, the method may be referred to as an encapsulation protocol checksum method.

Using the encapsulation protocol checksum method, the network packet source does not have to fill in the checksum field(s) of the network packets, and the network packet destination does not have to validate the network packets according to the checksum; checksumming operations are instead handled at the encapsulation layer at the source and destination, and a checksum field of the encapsulation protocol is used instead of the checksum field(s) of the network packets. By performing a single checksum for the encapsulation packet at the encapsulation layer, embodiments of the encapsulation protocol checksum method may reduce the amount of overhead as checksum computation is only initiated at the encapsulation layer rather than at both the encapsulation layer and the network packet source and destination as in conventional packet encapsulation techniques.

In addition, by moving the checksum to the encapsulation layer and performing the checksum on the encapsulation packet, embodiments of the encapsulation protocol checksum method may allow checksum algorithms to be used that provide stronger error detection than is provided by standard network protocol checksum mechanisms. In addition, in some embodiments the encapsulation protocol checksum method may allow error correction techniques to be used, thus reducing the need for retransmissions. For example, the encapsulation protocol may use a larger checksum field (e.g., a 32-bit field, 64-bit field, etc.) than is used in many conventional network protocols, including protocols such as UDP and TCP, allowing more robust error detection or error correction technology to be used such as 32-bit cyclic redundancy code (CRC32) technology and erasure coding technology.

In addition, by moving the checksum to the encapsulation layer, in some implementations the encapsulation protocol checksum method may allow checksum operations to be performed at least in part in hardware rather than in software by offloading checksum operations to hardware on the device rather than performing the operations via conventional execution of software instructions within a central processing unit (CPU). The hardware to which checksum operations are offloaded may include special processors on the device other than the CPU, as well as special instructions implemented by the CPU. For example, some embodiments may leverage special instructions provided by one or more general purpose central processing units (CPUs) to perform checksum computation. As another example, some embodiments may offload checksum computation from the CPU to external (to the CPU) hardware such as a network interface card (NIC), graphic processing unit (GPU), or other hardware on the device. Offloading checksum operations onto hardware may reduce CPU overhead as conventional software calculations of checksums on CPUs may consume a considerable amount of CPU resources.

As an example, the encapsulation protocol checksum method may be implemented in network environments as described herein (see, e.g., FIGS. 9 through 12) in which hardware virtualization technology enables multiple operating systems to run concurrently on a host computer, i.e. as virtual machines (VMs) on the hosts. A hypervisor, or virtual machine monitor (VMM), on a host presents the VMs on the host with a virtual platform and monitors the execution of the VMs. The VMs may generate and consume network packets (e.g., TCP or UDP packets), while the VMMs provide the encapsulation layer that encapsulates the network packets for transmission over a network substrate according to an encapsulation protocol and that de-encapsulates the network packets received over the network substrate. In such an environment, offloading of operations onto hardware is typically easier to perform at the VMMs than at the VMs.

In addition, by moving the checksum to the encapsulation layer, the encapsulation protocol checksum method may allow different checksum algorithms that provide different levels of error detection and/or correction to be used based on one or more criteria. For example, the encapsulation layer at a source may evaluate one or more transmission quality criteria for a transmission path to a destination to determine a level of confidence in the quality of the path and, based on the level of confidence, select a checksum algorithm that provides an adequate amount of error detection, and possibly error correction, for the path. Other criteria that may be considered in determining a checksum algorithm may include, but are not limited to, support for the algorithm on the source and destination nodes or devices, efficiency of the algorithm on the source and/or destination node (e.g., can checksumming be offloaded to hardware?), and resource (e.g., CPU) load on the source and/or destination nodes. Note that more robust error detection and error correction techniques generally require more intensive and expensive operations and more checksum bits (e.g., 32 or 64 bits instead of 16 bits).

By allowing checksum algorithms to be selected according to one or more criteria including but not limited to the quality of the paths, the encapsulation protocol checksum method may allow resource usage to be balanced with the need for error detection and correction, with algorithms that provide a lower level of error detection, or even no error detection, used for the paths in which the confidence is highest, while algorithms that provide stronger error detection or error correction are used for the paths in which the confidence is lowest.

Figure 3:
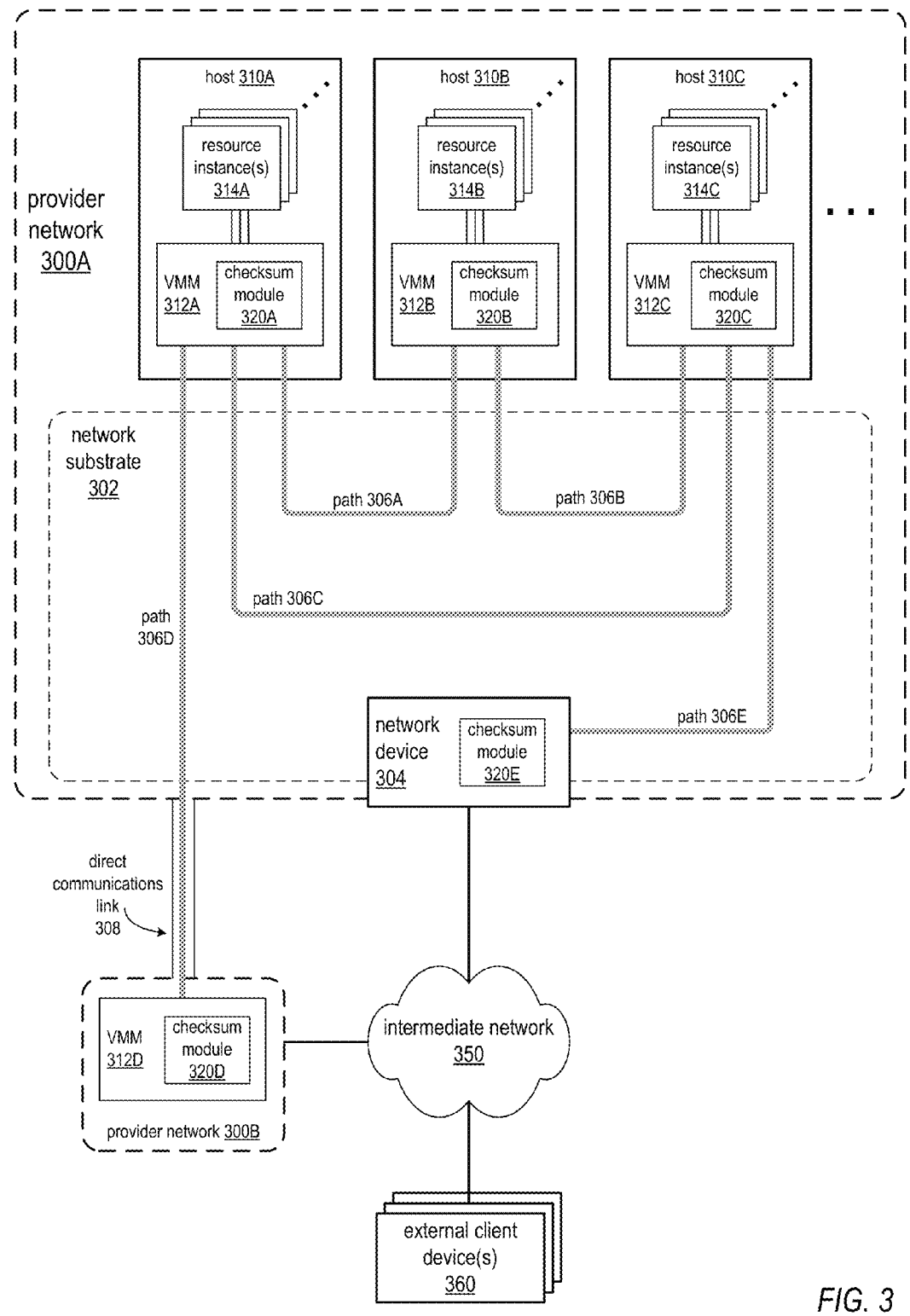
FIG. 3 illustrates an example provider network environment in which embodiments of the methods and apparatus for checksumming encapsulation packets may be implemented, according to at least some embodiments.
Figure 13:
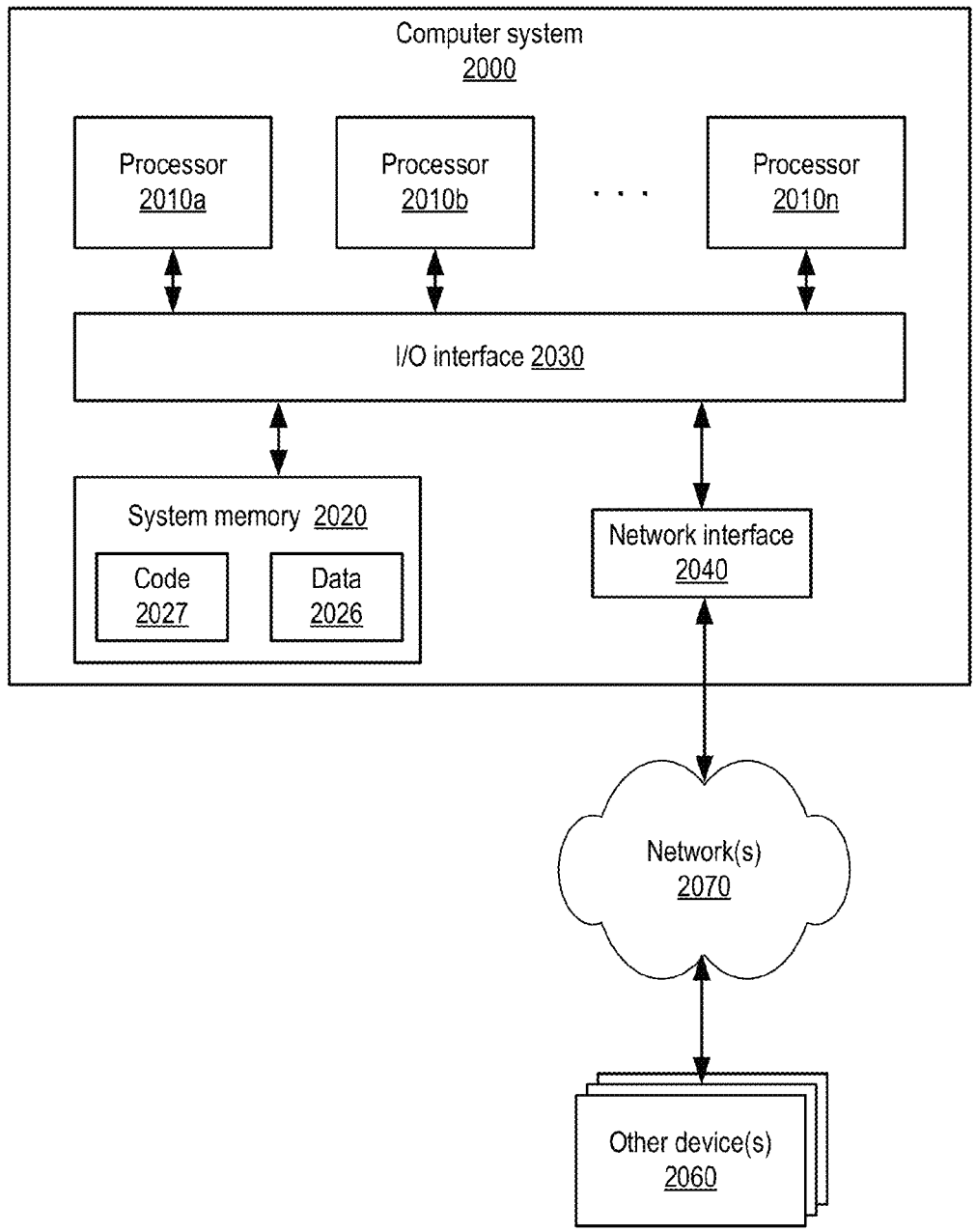
FIG. 13 is a block diagram illustrating an example computer system that may be used in some embodiments.

Embodiments of the encapsulation protocol checksum method may, for example be implemented as or in an encapsulation layer checksum module, which may be referred to herein as a checksum module for simplicity. The checksum module may, for example, be implemented on one or more computing systems within a network environment, for example by virtual machine monitors (VMMs) on host systems within a virtualized resource service in a service provider's network environment as illustrated in FIG. 3. However, the encapsulation protocol checksum method as described herein may be implemented in any packet-based networking environment in which an encapsulation technique is used to send encapsulated network packets from packet sources to packet destinations. An example computer system on which embodiments of the encapsulation protocol checksum method may be implemented is illustrated in FIG. 13.

FIG. 1A is a high-level flowchart of an encapsulation protocol checksum method, according to at least some embodiments. In FIG. 1A, network packets are transmitted from a packet source on a network to a packet destination on the network via a network substrate. As indicated at 100, the packet source generates one or more network packets without performing a checksum operation on the packet(s), and thus without a checksum value in the checksum field of the network packet header(s). The generated network packet(s) are obtained by the encapsulation layer. For example, the packet source may be a VM on a host system, and the encapsulation layer may be implemented as or by a VMM on the host system, as illustrated in FIG. 3.

As indicated at 102, the encapsulation layer encapsulates the network packet(s) according to an encapsulation protocol to generate an encapsulation packet (which may also be referred to herein as a network substrate packet). See FIG. 5 for an example encapsulation packet that encapsulates one or more network packets and includes an encapsulation header. The encapsulation header may include, but is not limited to, address and other information for routing the encapsulation packet to the destination over the network substrate according to the encapsulation protocol.

As indicated at 104, the encapsulation layer generates a checksum for the encapsulation packet according to a checksum algorithm. In at least some embodiments, the encapsulation layer generates a checksum value for the entire encapsulation packet including the encapsulation metadata (minus the checksum field) and the encapsulation packet payload (the network packet(s)). Alternatively, in some embodiments, the encapsulation layer may perform checksumming of only the encapsulation packet payload (the encapsulated network packet(s)).

Figure 6:
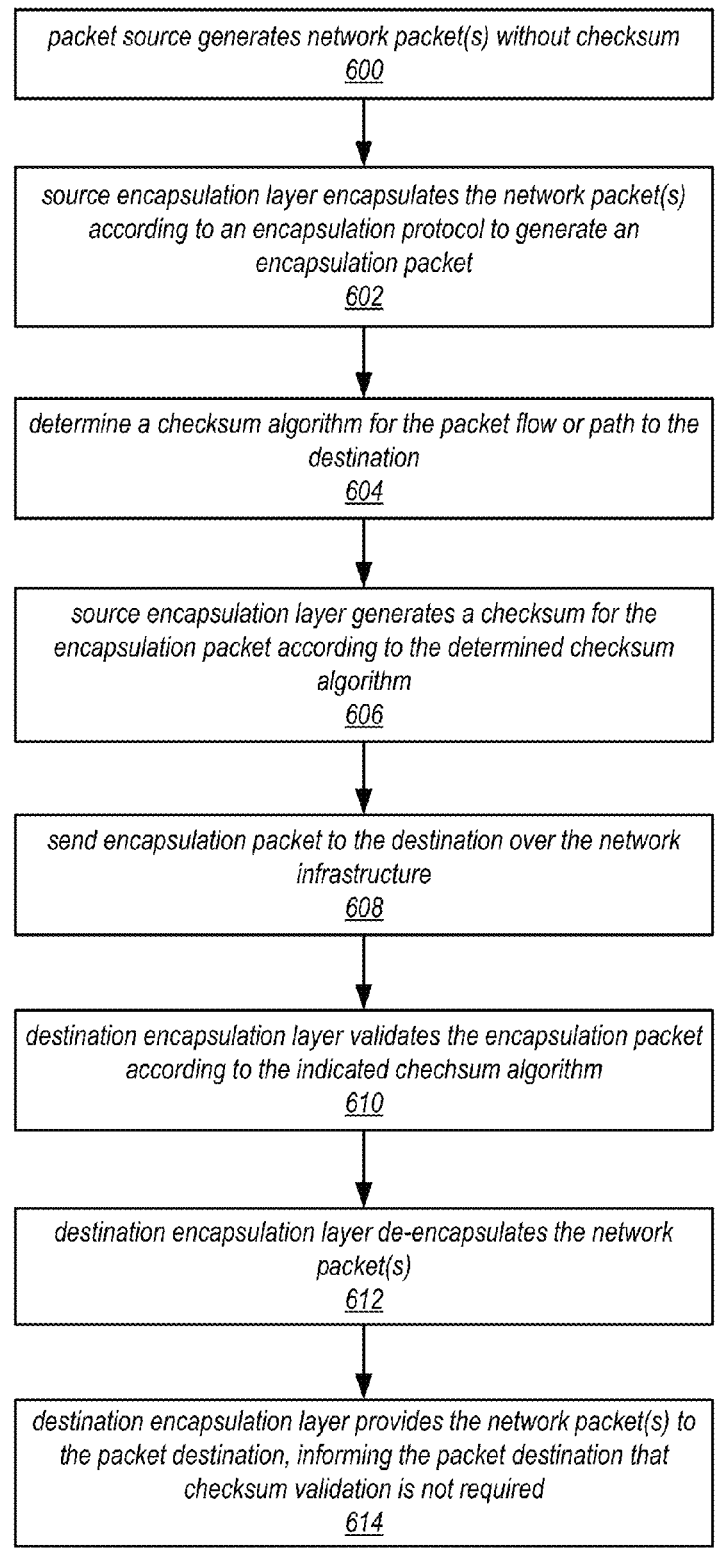
FIG. 6 is a high-level flowchart of an encapsulation protocol checksum method in which a checksum algorithm is selected from among several checksum algorithms based on one or more criteria, according to at least some embodiments.
Figure 7:
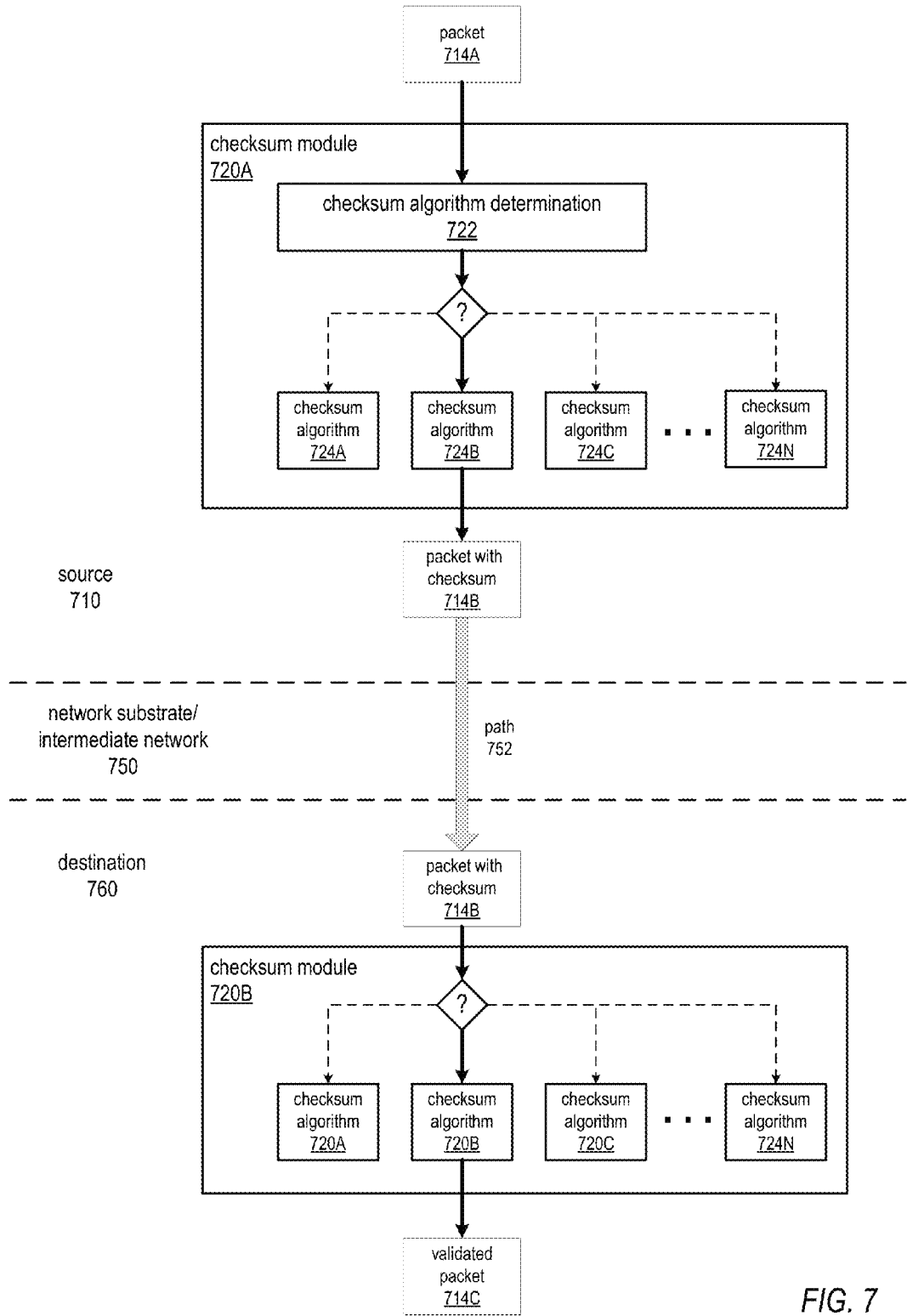
FIG. 7 is a high-level block diagram of a checksum technique in which a checksum algorithm is selected from among several checksum algorithms based on one or more criteria, according to at least some embodiments.

Any of various checksum algorithms may be used to generate the checksum in various embodiments. However, in at least some embodiments, a stronger checksum algorithm than the standard checksum algorithms used by conventional network protocols such as TCP or UDP may be used, for example a 32-bit checksum algorithm such as CRC32 technology algorithms rather than a standard 16-bit checksum algorithm. In at least some embodiments, a checksum algorithm that allows error correction may be used, such as Reed-Solomon technology or erasure coding technology algorithms. In at least some embodiments, the checksum algorithm that is used may be selected from among several checksum algorithms, for example based on a determined level of confidence in the quality of the path over which the encapsulation packet is to be transmitted, as illustrated in FIGS. 6 and 7.

The generated checksum value is written to a checksum field in the encapsulation header of the encapsulation packet. See FIG. 5 for an example encapsulation packet with a checksum in the encapsulation header. In addition, other information related to the checksum may be written to the encapsulation header, such as an indication of whether or not checksumming has been performed and an indication of the checksumming algorithm that was used on the encapsulation packet.

As indicated at 106, the encapsulation layer sends the encapsulation packet to the destination. The encapsulation packet may be routed to the destination over the network substrate according to the routing information in the encapsulation packet header. At the destination, the encapsulation packet may be received by an encapsulation layer. For example, the destination may be a VM on a host system, and the encapsulation layer may be implemented as or by a VMM on the host system, as illustrated in FIG. 3.

Figure 8:
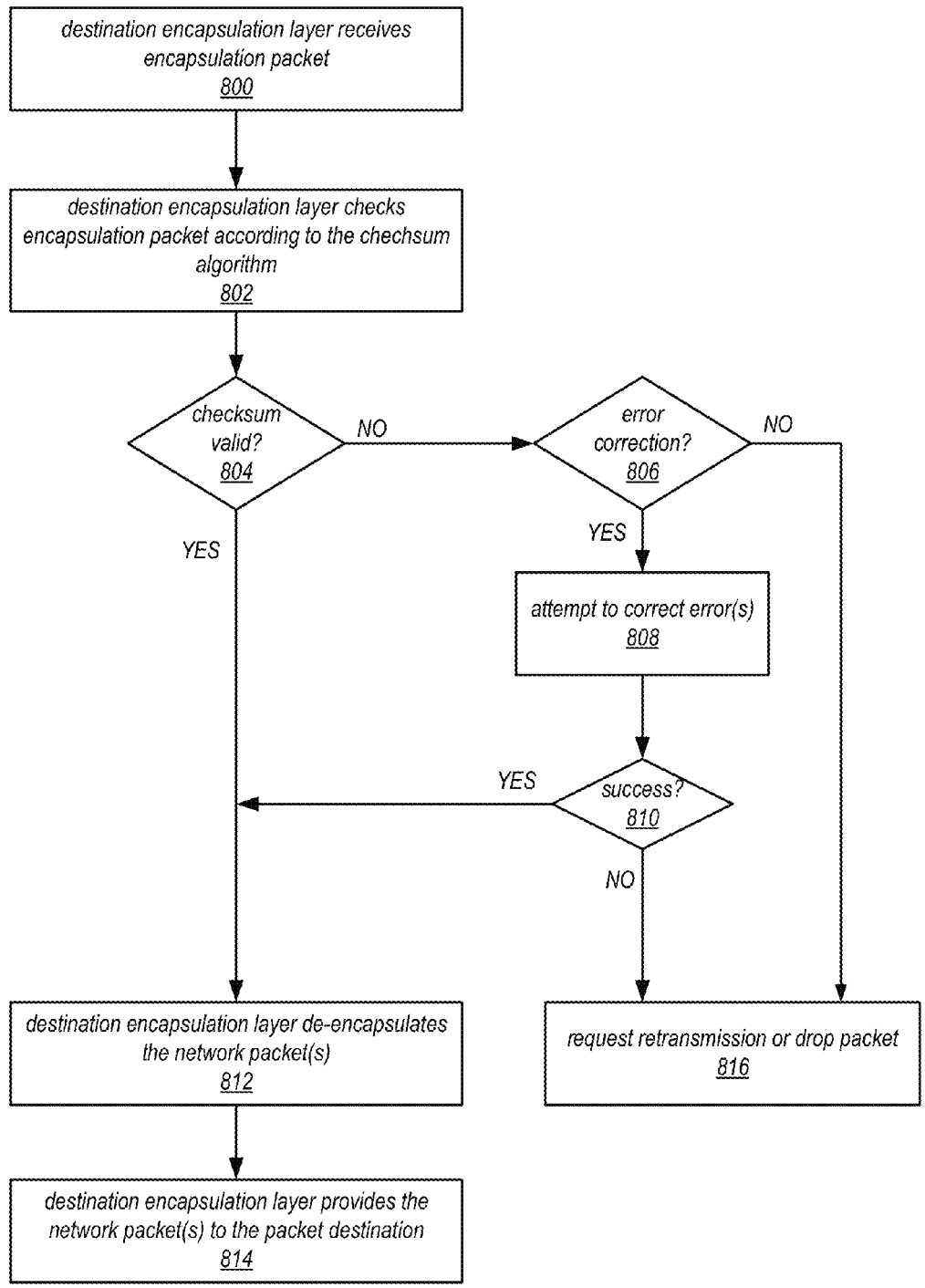
FIG. 8 is a flowchart of a method for handling errors detected in encapsulation packets using checksumming, according to at least some embodiments.

As indicated at 108 of FIG. 1, after receiving the encapsulation packet, the encapsulation layer at the destination validates the encapsulation packet using the checksum value in the checksum field in the encapsulation header of the packet. In at least some embodiments, to validate the packet, the encapsulation layer generates a checksum value for the entire encapsulation packet (minus the checksum field) using the same checksum algorithm that was used to generate the checksum value in the encapsulation header and compares the generated checksum value to the checksum value in the encapsulation header. If the two checksum values are the same, then it is highly probable that the encapsulation packet was not accidentally altered during transmission. If the two checksum values differ, then at least one error has been introduced into the encapsulation packet during transmission. A method for handling error(s) detected in encapsulation packets using checksumming is illustrated in FIG. 8, which is described later in this document.

As indicated at 110, after validating the encapsulation packet, the encapsulation layer at the destination de-encapsulates the network packet(s) from the encapsulation packet. As indicated at 112, the encapsulation layer provides the network packet(s) to the packet destination. In at least some embodiments, the encapsulation layer informs the packet destination that checksum validation is not required for the network packet(s). For example, the packet destination may be a VM on a host system, and the encapsulation layer may be implemented as or by a VMM on the host system, as illustrated in FIG. 3.

Figure 1B:
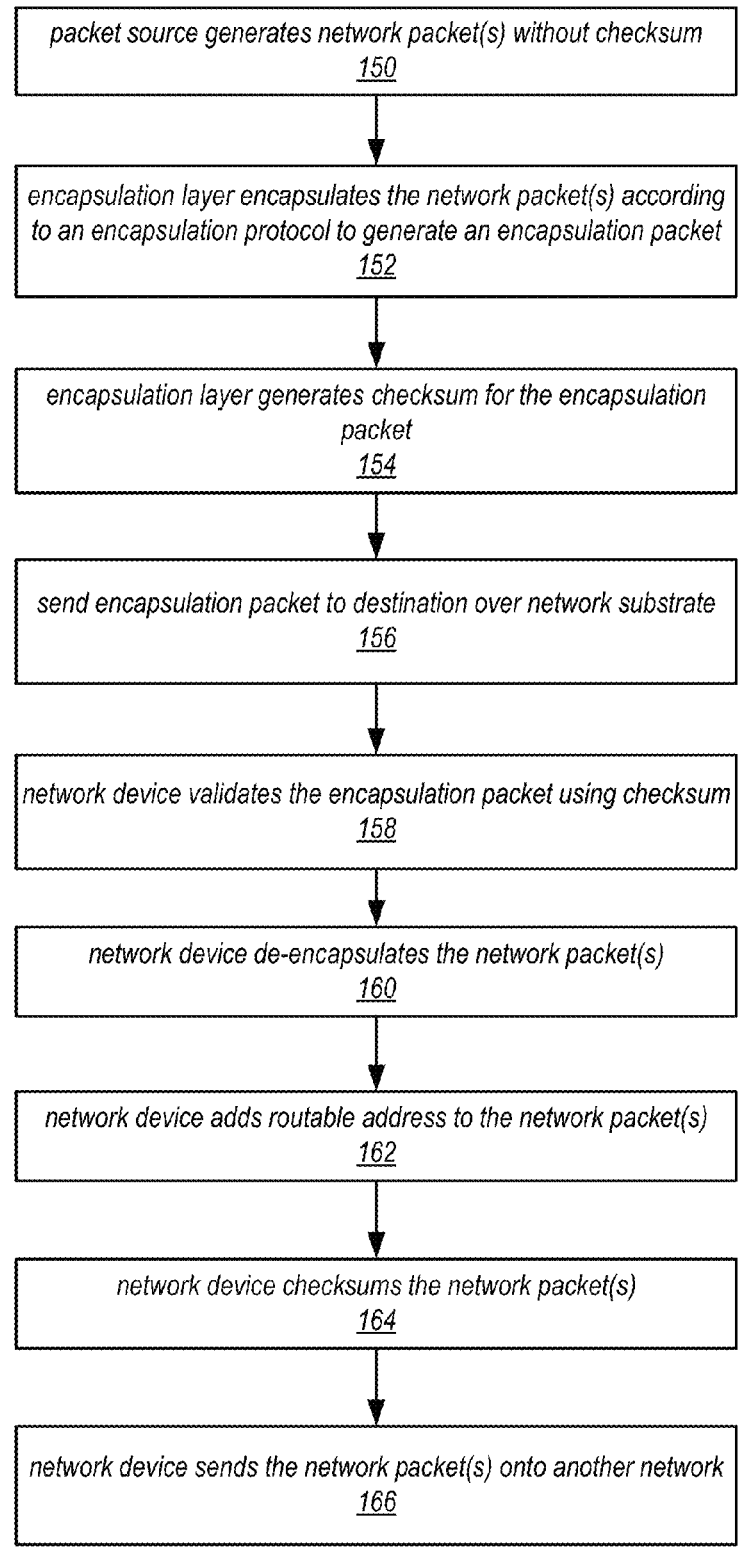
FIG. 1B is a high-level flowchart of an encapsulation protocol checksum method in which data packets are sent from a packet source on a network to a packet destination on another network, according to at least some embodiments.

As previously mentioned, in FIG. 1A, network packets are being transmitted from a packet source on a network to a packet destination on the network via a network substrate. Both the packet source and packet destination are fronted by an encapsulation layer. For example, the packet source and packet destination may be VMs on host systems, and the encapsulation layers may be implemented by VMMs on the host systems, on a provider network as illustrated in FIG. 3. However, in at least some implementations, a packet source may transmit network packets to destinations on other networks, for example via an intermediate network such as the Internet. For example, the packet source may be a VM on a host system on a provider network, and the destination may be an external client device, as illustrated in FIG. 3. In such cases, the destination may not include an encapsulation layer as described herein, and thus it may be necessary to perform standard network protocol checksumming on the network packet(s) prior to transmission to the destination via the intermediate network. FIG. 1B is a high-level flowchart of an encapsulation protocol checksum method in which data packets are being sent from a packet source on a network to a packet destination on another network via a network device, according to at least some embodiments.

As indicated at 150, a packet source on a source node or device generates one or more network packets without performing a checksum operation on the network packet(s), and thus without a checksum value in the checksum field of the network packet header(s). The generated network packet(s) are obtained by the encapsulation layer on the source node or device. For example, the packet source may be a VM on a host system, and the encapsulation layer may be implemented as or by a VMM on the host system, as illustrated in FIG. 3.

As indicated at 152, the encapsulation layer on the source node or device encapsulates the network packet(s) according to an encapsulation protocol to generate an encapsulation packet. The encapsulation header may include address and other information for routing the encapsulation packet to the destination via a path over the network substrate.

As indicated at 154, the encapsulation layer on the source node or device generates a checksum for the encapsulation packet according to a checksum algorithm. In at least some embodiments, the encapsulation layer generates a checksum value for the entire encapsulation packet including the encapsulation metadata (minus the checksum field) and the encapsulation packet payload (the network packet(s)). Alternatively, in some embodiments, the encapsulation layer may perform checksumming of only the encapsulation packet payload (the encapsulated network packet(s)).

The checksum value is written to a checksum field in the encapsulation header (or footer) of the encapsulation packet. See FIG. 5 for an example encapsulation packet with a checksum in the encapsulation header. In addition, other information related to the checksum may be written to the encapsulation header (or footer), such as an indication of whether or not checksumming has been performed and an indication of the checksumming algorithm that was used on the encapsulation packet.

As indicated at 156, the encapsulation layer on the source node or device sends the encapsulation packet to the destination over the network substrate. In this case, the destination of the network packet(s) is a device that is not on the network that contains the source node, and thus the encapsulation packet may be routed to a network device (e.g., a router, server, or other device) on the network according to the routing information in the encapsulation packet header. At the network device, an encapsulation layer or encapsulation module may receive the encapsulation packet. For example, the destination of the encapsulated network packet(s) may be an external client device 360, and the network device may be a network device 304 that couples the provider network 300A to an intermediate network 350, as illustrated in FIG. 3. As another example, the source node may be on a network that is a subnetwork or partition of a larger network (e.g., a provider network as illustrated in FIG. 3), the destination of the encapsulated network packet(s) may be an endpoint on another network that is a subnetwork or partition of the larger network, and the network device may be a device that facilitates communications between the two networks.

As indicated at 158 of FIG. 1B, the network device, after receiving the encapsulation packet, may validate the encapsulation packet using the checksum value in the checksum field in the encapsulation header of the packet. As indicated at 160, after validating the encapsulation packet, the network device de-encapsulates the network packet(s) from the encapsulation packet. As indicated at 162, the network device may add a routable network address (e.g., a routable IP address) to the network packet(s) so that the network packet(s) can be routed via the other network to the correct destination.

As indicated at 164, the network device may perform checksumming of the network packet(s) according to the protocol(s) of the packet(s), for example according to standard network protocol checksum mechanism(s) such as a standard TCP checksum or standard UDP checksum depending on the network packet protocol. As previously noted, a network packet may include one, two, or more headers according to protocols used at the various protocol layers (e.g., Layer 3 and Layer 4 headers), each header including metadata for a network protocol used at the respective layer. One or more of the layers may require a checksum, and thus in some implementations a separate checksum may be generated for one, two or more protocol layers, e.g. a Layer 3 and Layer 4 checksum. The generated checksum(s) may then be written to the checksum field(s) of the network packet header(s).

As indicated at 166, the network device then sends the network packet(s) onto the other network for delivery to the network packet destination (e.g., a node or device on the other network). The network packet destination may then validate the network packet(s) according to the checksum value(s) in the network packet header(s), requesting retransmission and/or dropping packets according to the validation of the checksum(s) if necessary.

Figure 2A:
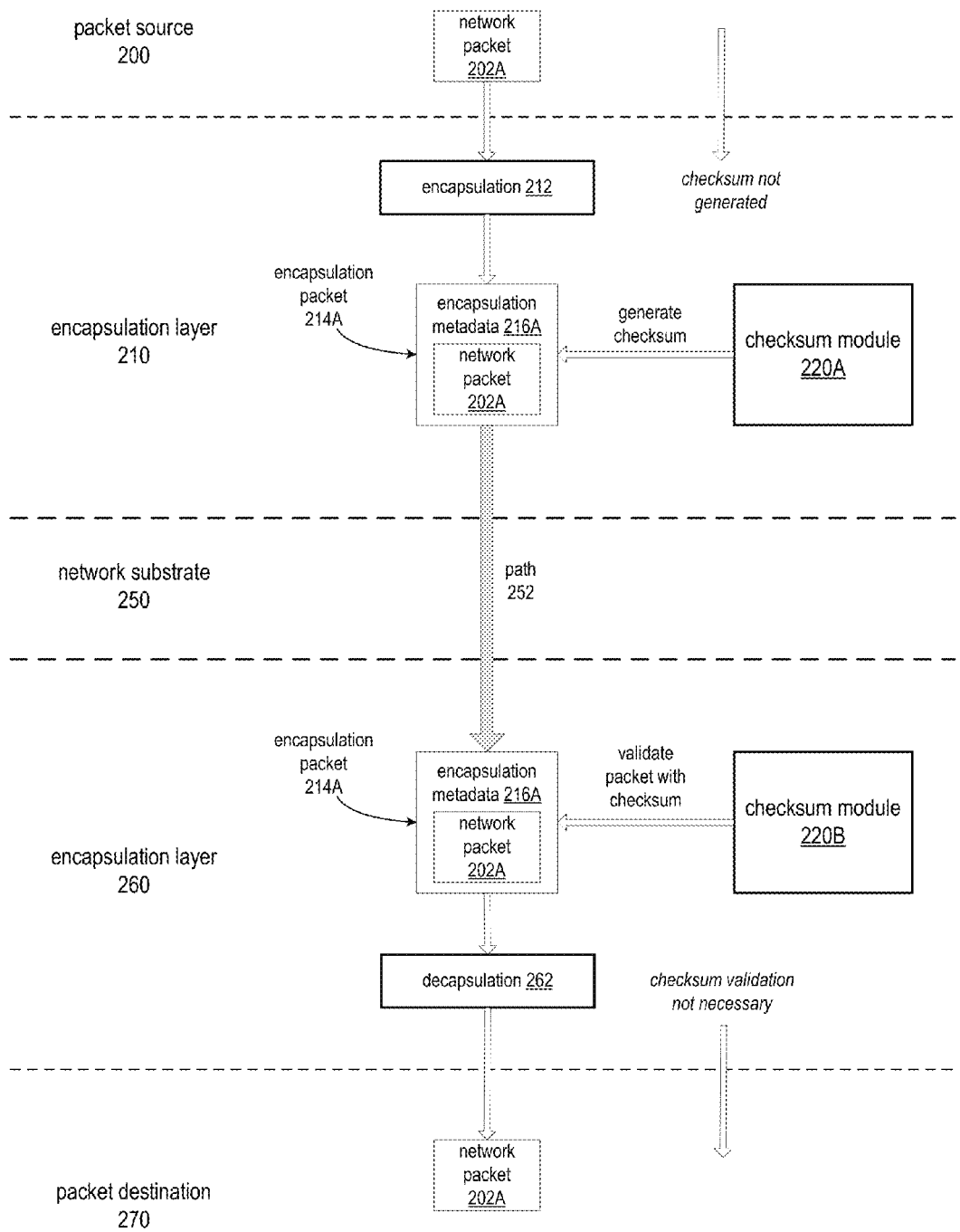
FIG. 2A illustrates transmitting network packets from a packet source on a network to a packet destination on the network over the network substrate, according to at least some embodiments of an encapsulation protocol checksum method.
Figure 2B:
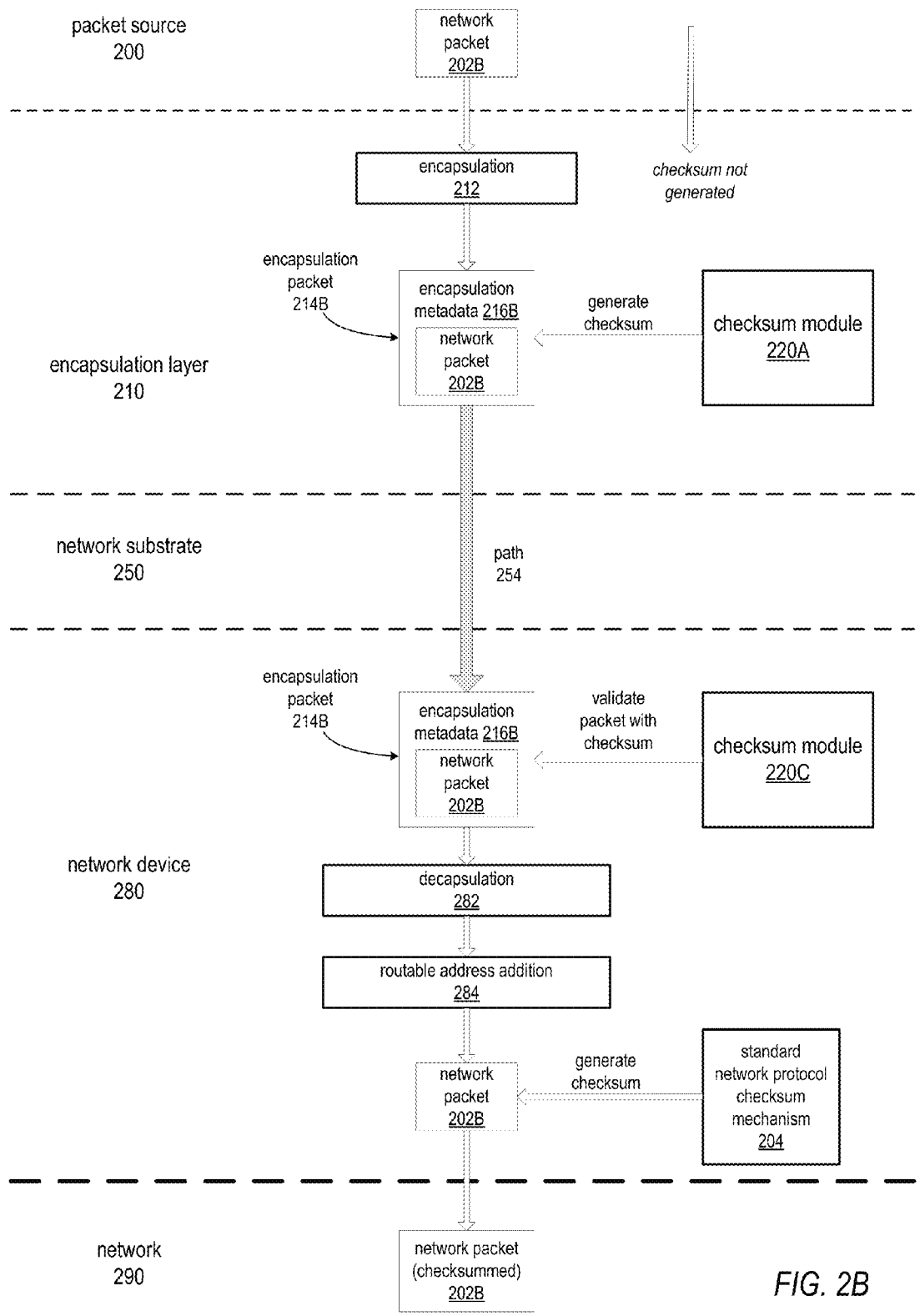
FIG. 2B illustrates sending network packets from a packet source on a network to a packet destination on another network, according to at least some embodiments of an encapsulation protocol checksum method.
Figure 2C:
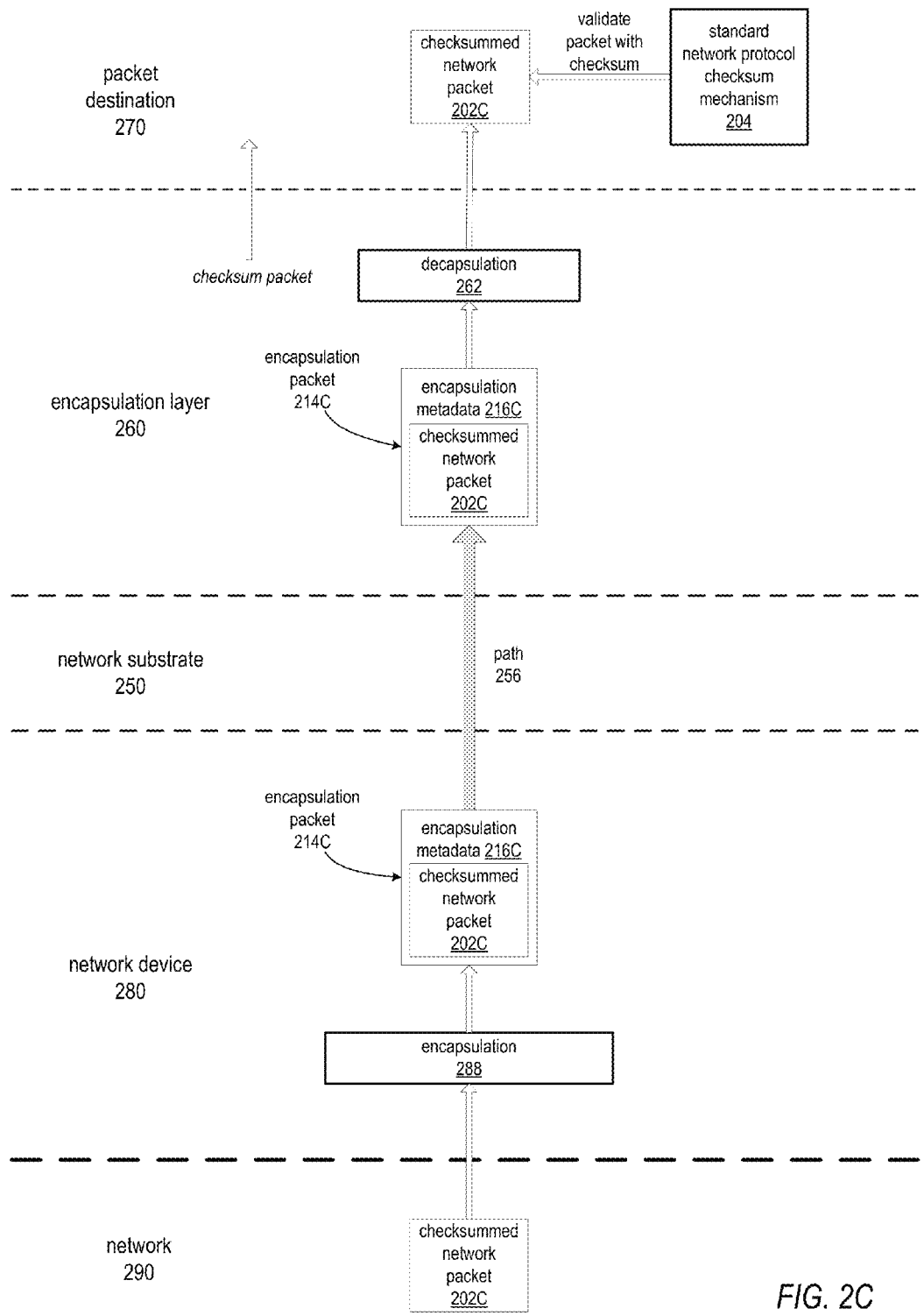
FIG. 2C illustrates receiving checksummed network packets from a device on another network via a network device, encapsulating the network packets, and routing the encapsulated network packets to a packet destination on the network over the network substrate, according to at least some embodiments.

FIGS. 2A through 2C are block diagrams that illustrate methods and apparatus for checksumming encapsulation packets, according to at least some embodiments. In FIG. 2A, network packets are being transmitted from a packet source on a network to a packet destination on the network over the network substrate. In FIG. 2B, network packets are being sent from a packet source on a network to a packet destination on another network via a network device (e.g., an edge router). In FIG. 2C, network packets are being received from an external packet source on another network via a network device (e.g., an edge router) on the network, encapsulated, and routed to a packet destination on the network over the network substrate.

FIG. 3 illustrates an example provider network environment in which FIGS. 2A, 2B, and/or 2C may be implemented.

FIG. 2A illustrates transmitting network packets from a packet source on a network to a packet destination on the network over the network substrate, according to at least some embodiments. In FIG. 2A, the packet source 200 generates one or more network packets 202A without performing a checksum operation on the packet 202A, and thus without a checksum value in the checksum field of the network packet 202A header(s). The generated network packet(s) 202A are obtained by the encapsulation layer 210. For example, the packet source 200 may be a VM on a host system, and the encapsulation layer 210 may be implemented as or by a VMM on the host system, on a provider network as illustrated in FIG. 3. In at least some embodiments, the packet source 200 may inform the encapsulation layer 210 that a checksum was not performed on the network packet(s) 202A.

At the encapsulation layer 210, an encapsulation 212 module or function encapsulates the network packet(s) 202A according to an encapsulation protocol to generate an encapsulation packet 214A (which may also be referred to as a network substrate packet). See FIG. 5 for an example encapsulation packet that encapsulates one or more network packets and that includes an encapsulation header. The encapsulation packet 214A includes encapsulation metadata 216A in the encapsulation header which may include, but is not limited to, address and other information for routing the encapsulation packet 214A to the destination indicated by the network packet 202A via a path 252 over the network substrate 250 according to the encapsulation protocol.

The encapsulation layer 210 may invoke a checksum module 220A to generate a checksum for the encapsulation packet 214A. The checksum module 220A may be implemented in hardware, software, or a combination thereof. For example, in at least some embodiments, a host system on which encapsulation layer 210 is implemented may include one or more central processing units (CPUs) that provide instructions which may be used in computing checksums of data packets, and that may be leveraged by the checksum module 220A. Checksum module 220A may implement any of various checksum algorithms to generate the checksum in various embodiments. However, in at least some embodiments, a stronger checksum algorithm than the standard checksum algorithms used by network protocols such as TCP or UDP may be implemented by checksum module 220A, for example a 32-bit checksum algorithm such as 32-bit cyclic redundancy code (CRC32) technology algorithms rather than a standard 16-bit checksum algorithm. In at least some embodiments, a checksum algorithm that allows error correction may be used, such Reed-Solomon technology or erasure coding technology algorithms. In at least some embodiments, the checksum algorithm that is used by checksum module 220A may be selected from among several checksum algorithms as illustrated in FIGS. 6 and 7, for example based on a determined level of confidence in the quality of the path over which the encapsulation packet 214A is to be transmitted.

In at least some embodiments, checksum module 220A generates a checksum value for the entire encapsulation packet 214A including the encapsulation metadata 216A (minus the checksum field) and the encapsulation packet payload (the network packet(s) 202A). Alternatively, in some embodiments, checksum module 220A may perform checksumming of only the encapsulation packet payload (the encapsulated network packet(s) 202A).

The generated checksum value may be written to a checksum field in the encapsulation header (or footer) of the encapsulation packet 214A as additional encapsulation metadata 216A. In at least some embodiments, the checksum field may be a larger checksum field (e.g., a 32-bit field, 64-bit field, etc.) than the 16-bit field used in network protocols such as UDP and TCP, allowing other and more robust error detection or error correction technology to be used, such as CRC32 technology and erasure coding technology, than the error detection technology provided by standard network protocol checksum mechanisms.

In addition to the checksum value, other information related to the checksum may be written as encapsulation metadata 216A to the encapsulation packet 214A, such as an indication of whether or not checksumming has been performed on the encapsulation packet 214A and an indication of the particular checksumming algorithm that was used on the encapsulation packet 214A.

After the checksum has been generated and written to the encapsulation packet 214A, the encapsulation layer 210 sends the encapsulation packet 214A to the destination indicated by the network packet 202A. The encapsulation packet 214A may be routed to the destination via a path 252 over the network substrate 250 according to the routing information in the encapsulation header of the packet 214A. At the destination, the encapsulation packet may be received by an encapsulation layer 260. For example, the destination may be a VM on a host system, and the encapsulation layer 260 may be implemented as or by a VMM on the host system, as illustrated in FIG. 3.

After receiving the encapsulation packet 214A, the encapsulation layer 260 at the destination validates the encapsulation packet 214A using the checksum value in the checksum field in the encapsulation header of the packet 214A. In at least some embodiments, to validate the packet 214A, the encapsulation layer 260 invokes checksum module 220B to generate a checksum for the entire encapsulation packet 214A (minus the checksum field). Alternatively, in some embodiments, checksum module 220B may perform checksum validation for only the encapsulation packet payload (the encapsulated network packet(s)).

The checksum module 220B uses the same checksum algorithm that was used by checksum module 220A at the source to generate the checksum value in the encapsulation metadata 216A and compares the generated checksum value to the checksum value from the encapsulation metadata 216A. In at least some embodiments, the checksum module 220B determines the checksum algorithm that was used according to information related to the checksum that was written as encapsulation metadata 216A to the encapsulation packet 214A at encapsulation layer 210. If the two checksum values are the same, then it is highly probable that the encapsulation packet 214A was not accidentally altered during transmission. If the two checksum values differ, then at least one error has been introduced into the encapsulation packet 214A during transmission. A method for handling error(s) detected in encapsulation packets using checksumming is illustrated in FIG. 8, which is described later in this document.

After validating the encapsulation packet 214A, a decapsulation 262 module or function at the encapsulation layer 260 de-encapsulates the network packet(s) 202A from the encapsulation packet 214A. The encapsulation layer 260 then provides the network packet(s) 202A to the packet destination 270. In at least some embodiments, the encapsulation layer 260 informs the packet destination 270 that checksum validation is not required for this network packet(s) 202A. For example, the packet destination 270 may be a VM on a host system, and the encapsulation layer 260 may be implemented as or by a VMM on the host system, as illustrated in FIG. 3.

FIG. 2B illustrates sending network packets from a packet source on a network to a packet destination on another network via a network device, according to at least some embodiments. For example, in FIG. 2B, the packet source 200 may be a VM on a host system on a provider network, the encapsulation layer 210 may be implemented as or by a VMM on the host system, the network device 280 may be a network device that couples the provider network to an intermediate network (network 290), and the packet destination may be a client device coupled to the intermediate network, as illustrated in FIG. 3. As another example, the packet source 200 and encapsulation layer 210 may be implemented on a node or host device on a network that is a subnetwork or partition of a larger network (e.g., a provider network as illustrated in FIG. 3), the destination of the encapsulated network packet(s) may be an endpoint on another network 290 that is a subnetwork or partition of the larger network, and the network device 280 may be a device that facilitates communications between the two networks.

In FIG. 2B, the packet source 200 generates one or more network packets 202B without performing a checksum operation on the packet 202B, and thus without a checksum value in the checksum field of the network packet 202B header(s). The network packet(s) 202B are obtained by the encapsulation layer 210. In at least some embodiments, the packet source 200 may inform the encapsulation layer 210 that a checksum was not performed on the network packet(s) 202B.

At the encapsulation layer 210, an encapsulation 212 module or function encapsulates the network packet(s) 202B according to an encapsulation protocol to generate an encapsulation packet 214B. See FIG. 5 for an example encapsulation packet that encapsulates one or more network packets and that includes an encapsulation header. The encapsulation packet 214B includes encapsulation metadata 216B in the encapsulation header that may include, but is not limited to, address and other information for routing the encapsulation packet 214B to the destination indicated by the network packet 202B. In FIG. 2B, the destination of the network packet 202B is a network address (e.g., an IP address) of a device on an external network, and thus the routing information may allow the encapsulation packet to be routed to a network device 280 via a path 254 over the network substrate 250 according to the encapsulation protocol.

The encapsulation layer 210 may invoke a checksum module 220A to generate a checksum for the encapsulation packet 214B, and the generated checksum value may be written to a checksum field of the encapsulation packet 214B as additional encapsulation metadata 216B, as described above in reference to FIG. 2A. In at least some embodiments, the checksum field in the encapsulation packet 214B may be a larger checksum field (e.g., a 32-bit field, 64-bit field, etc.) than the 16-bit field used in network protocols such as UDP and TCP, allowing other and more robust error detection and correction technology to be used, such as CRC32 technology and erasure coding technology, than the error detection technology provided by standard network protocol checksum mechanisms. In addition to the checksum value, other information related to the checksum may be written as encapsulation metadata 216B to the encapsulation packet 214B, such as an indication of whether or not checksumming has been performed on the encapsulation packet 214B and an indication of the checksumming algorithm that was used on the encapsulation packet 214B.

In at least some embodiments, checksum module 220A generates a checksum value for the entire encapsulation packet 214B including the encapsulation metadata 216B (minus the checksum field) and the encapsulation packet payload (the network packet(s) 202B). Alternatively, in some embodiments, checksum module 220A may perform checksumming of only the encapsulation packet payload (the encapsulated network packet(s) 202B).

After the checksum has been generated and written to the encapsulation packet 214B, the encapsulation layer 210 sends the encapsulation packet 214B to network device 280 via a path 254 over the network substrate 250. After receiving the encapsulation packet 214B, network device 280 may validate the encapsulation packet 214B using the checksum value in the checksum field in the encapsulation header of the packet 214B. In at least some embodiments, to validate the packet 214B, network device 280 invokes checksum module 220C to generate a checksum for the entire encapsulation packet 214B (minus the checksum field). Alternatively, in some embodiments, checksum module 220C may perform checksum validation for only the encapsulation packet payload (the encapsulated network packet(s)).

The checksum module 220C uses the same checksum algorithm that was used by checksum module 220A at the source to generate the checksum value in the encapsulation metadata 216B and compares the generated checksum value to the checksum value in the encapsulation metadata 216B. In at least some embodiments, the checksum module 220C determines the checksum algorithm that was used according to information related to the checksum that was written as encapsulation metadata 216B to the encapsulation packet 214B at encapsulation layer 210. If the two checksum values are the same, then it is highly probable that the encapsulation packet 214B was not accidentally altered during transmission. If the two checksum values differ, then at least one error has been introduced into the encapsulation packet 214B during transmission. A method for handling error(s) detected in encapsulation packets using checksumming is illustrated in FIG. 8, which is described later in this document.

After validating the encapsulation packet 214B, a decapsulation 282 module or function of the network device 280 de-encapsulates the network packet(s) 202B from the encapsulation packet 214B. A routable network address 284 module or function of network device 280 may add a routable address (e.g., an IP address) to the network packet(s) 202B so that the network packet(s) 202B can be routed via network 290 to the correct destination address of a device on an external network. The network device 280 may perform checksumming of the network packet(s) 202B, for example according to a standard network protocol checksum mechanism 204, for example a standard TCP checksum or standard UDP checksum depending on the network packet type. As previously noted, a network packet may include one, two, or more headers according to protocols used at the various protocol layers (e.g., Layer 3 and Layer 4 headers), each header including metadata for a protocol used at the respective layer. One or more of the layers may require a checksum, and thus in some implementations a separate checksum may be generated for one, two or more protocol layers, e.g. a Layer 3 and Layer 4 checksum. The generated checksum value(s) may then be written to the checksum field(s) of the network packet header(s).

The network device 280 then sends the checksummed network packet(s) 202B onto network 290 (which may, for example, be an intermediate network such as the Internet) for delivery to the packet destination according to the routable network address in the network packet header(s). Upon receiving the network packet(s) 202B, the packet destination may validate the network packet(s) according to the checksum value(s) in the network packet header(s), and/or dropping packets according to the validation of the checksum(s) if necessary.

FIG. 2C illustrates receiving checksummed network packets from a device on another network via a network device, encapsulating the network packets, and routing the encapsulated network packets to a packet destination on the network over the network substrate, according to at least some embodiments. For example, in FIG. 2C, the packet destination 270 may be a VM on a host system on a provider network, the encapsulation layer 260 may be implemented as or by a VMM on the host system, the network device 280 may be a network device that couples the provider network to an intermediate network (network 290), and the source of network packet 202 may be a client device coupled to the intermediate network. As another example, the packet destination 270 and encapsulation layer 260 may be implemented on a node or host device on a network that is a subnetwork or partition of a larger network, the source of the network packet 202 may be an endpoint on another network 290 that is a subnetwork or partition of the larger network, and the network device 280 may be a device that facilitates communications between the two networks.

In FIG. 2C, the network device 280 on the network may receive one or more checksummed network packets 202C from some packet source (e.g., a device on another network) via network 290. An encapsulation 288 module or function of network device 280 encapsulates the network packet(s) 202C according to an encapsulation protocol to generate an encapsulation packet 214C. While not shown, in at least some embodiments checksumming of the encapsulation packet 214C may be, but is not necessarily, performed at the network device 280 as previously described to generate a checksum value in the checksum field of the encapsulation packet 214C. The encapsulation packet 214C is then routed to the destination on the network via a path 256 over the network substrate 250 according to the encapsulation protocol.

At the destination (e.g., a host system on the network), an encapsulation layer 260 (e.g., a VMM on the host system) receives the encapsulation packet 214C via path 256. A decapsulation 262 module or function of the encapsulation layer 260 de-encapsulates the network packet(s) 202C from the encapsulation packet 214C and provides the network packet(s) 202C to the packet destination 270 (e.g., a VM on the host system). The encapsulation layer 260 may inform the packet destination that the packet destination should validate the network packet(s) 214C according to the checksum value(s) in the network packet header(s). The packet destination may then validate the network packet(s) using the checksum value in the network packet header(s) according to a standard network protocol checksum mechanism 204, for example a standard TCP checksum or standard UDP checksum depending on the network packet type.

While not shown, in at least some embodiments, if checksumming of the encapsulation packet 214C was performed at the network device 280 to generate a checksum value in the checksum field of the encapsulation packet 214C, then the encapsulation packet 214C may be validated according to a checksum module 220B by encapsulation layer 260 as shown in FIG. 2A prior to decapsulating the network packet(s) 214C.

Example Encapsulation Protocol Environment

Embodiments of the methods and apparatus for checksumming network packets encapsulated according to an encapsulation protocol may, for example, be implemented in the context of a service provider that provides to clients or customers, via an intermediate network such as the Internet, virtualized resources (e.g., virtualized computing and storage resources) implemented on a provider network 300 of the service provider, as illustrated in FIG. 3. FIGS. 9 through 12 and the section titled Example provider network environments further illustrate and describe example service provider network environments in which embodiments of the methods and apparatus as described herein may be implemented, and are not intended to be limiting. Referring to FIG. 3, in at least some embodiments, at least some of the resources provided to clients of the service provider via a provider network 300A may be virtualized computing resources implemented on multi-tenant hardware that is shared with other client(s) and/or on hardware dedicated to the particular client. Each virtualized computing resource may be referred to as a resource instance 314. Resource instances 314 may, for example, be rented or leased to clients of the service provider. For example, clients of the service provider, via external client device(s) 360 coupled to the provider network 300A via an intermediate network 350 such as the Internet, may access one or more services of the provider network 300A via APIs to the services to obtain and configure resource instances 314 and to establish and manage virtual network configurations that include the resource instances 314, for example virtualized private networks as illustrated in FIG. 12.

As shown in FIG. 3, in some implementations, the service provider may have two or more provider networks 300 (provider networks 300A and 300B are shown), which may be but are not necessarily implemented in different, possibly geographically distant, data centers. Two provider networks 300 may, for example, be coupled by one or more direct communications links 308, for example fiber optic connections. Instead or in addition, two provider networks 300 may communicate over the intermediate network 350.

At least some of the resource instances 314 may, for example, be implemented according to hardware virtualization technology that enables multiple operating systems to run concurrently on a host 310 computer, i.e. as virtual machines (VMs) on the hosts 310. A hypervisor, or virtual machine monitor (VMM) 312, on a host 310 presents the VMs 314 on the host 310 with a virtual platform and monitors the execution of the VMs 310. Each VM 314 may be provided with one or more private IP addresses; the VMM 312 on a respective host 310 may be aware of the private IP addresses of the VMs 314 on the host 310. For further information on hardware virtualization technology, see FIG. 10.

The provider network 300A may include a network substrate 302 that includes networking devices such as routers, switches, network address translators (NATs), and so on, as well as the physical connections among the devices. The VMMs 312 or other devices or processes on the network substrate 302 may use encapsulation protocol technology to encapsulate and route network packets (e.g., client IP packets) over the network substrate 302 between client resource instances 314 on different hosts 310 within the provider network 300A, to other devices or subnetworks on the provider network such as network device 304, or to other devices or client resource instances on other provider networks 300. The encapsulation protocol technology may be used on network substrate 302 to route encapsulated packets (network substrate packets) between endpoints on the network substrate 302 or to endpoints on other provider networks 300 via paths 306 or routes. The encapsulation protocol technology may be viewed as providing a virtual network topology overlaid on the network substrate 302. For an example implementation of and further information about a virtual network technology that uses an encapsulation protocol to implement an overlay network on a network substrate, see FIGS. 9 through 12.

Client resource instances 314 on the hosts 310 may communicate with other client resource instances 314 on the same host 310 or on different hosts 310 according to stateful protocols such as Transmission Control Protocol (TCP) and/or according to stateless protocols such as User Datagram Protocol (UDP). However, the client packets are encapsulated according to an encapsulation protocol by the sending VMM 312, sent over the network substrate 302 as network substrate packets according to the encapsulation protocol, and de-encapsulated by the receiving VMM 312. In at least some embodiments, the encapsulation protocol used on the network substrate 302 may be a stateless protocol. However, the encapsulation protocol may be a stateful protocol in some embodiments. VMM 312 on a host 310, upon receiving a client packet (e.g., a TCP or UDP packet) from a client resource instance 314 on the host 310 and targeted at a network address of another client resource instance 314, encapsulates or tags the client packet according to the encapsulation protocol and sends the network substrate packet (which may also be referred to herein as an encapsulation packet) onto the network substrate 302 for delivery. The network substrate packet may then be routed to another VMM 312 via the network substrate 302 according to information in the encapsulation protocol packet header. The other VMM 312 strips the encapsulation from the client packet and delivers the client packet (e.g., a TCP or UDP packet) to the appropriate VM on the host 310 that implements the target client resource instance 314. Note that in some implementations, two or more client packets may be encapsulated in a network substrate packet.

Using embodiments of the methods and apparatus for checksumming network packets encapsulated according to an encapsulation protocol, at least some of the VMMs 312 on provider networks 300A and 300B may each implement a checksum module 320 that implements an embodiment of the encapsulation protocol checksum method at the encapsulation layer as described herein. When sending network substrate (encapsulation) packets over the network substrate 302 between resource instances 314 on hosts 310 on provider network 300A as shown by example paths 306A, 306B, and 306C, the methods as described in FIGS. 1A and 2A may be applied to checksum the network substrate packets at the encapsulation layer (i.e., at the VMMs 312). In addition, in some embodiments, the methods as described in FIGS. 1A and 2A may be applied to checksum the network substrate packets at the encapsulation layer (i.e., at the VMMs 312) when sending network substrate packets between resource instances fronted by VMMs 312 on different provider networks 300A and 300B via a direct communication link 308 between the provider networks 300, as shown by path 306D between VMM 312A on provider network 300A and VMM 312D on provider network 300B.

In addition, in at least some embodiments, a network device 304 (e.g., an edge router) may implement a checksum module 320E. When a resource instance 314 is communicating with an external device via an intermediate network 350 such as a client device 360 on an external client network, the methods as described in FIGS. 1B, 2B, and 2C may be applied. For example, VMM 312C may send checksummed network substrate packets to network device 304 via path 306E over the network substrate 302; network device 304 may invoke checksum module 320E to validate the checksum, de-encapsulate the IP packets, add a routable IP address to the IP packets, checksum the IP packets according to a standard IP protocol checksumming mechanism, and send the checksummed IP packets onto the intermediate network 350 for routing to a client device 360 as described in FIGS. 1B and 2B.

Figure 4:
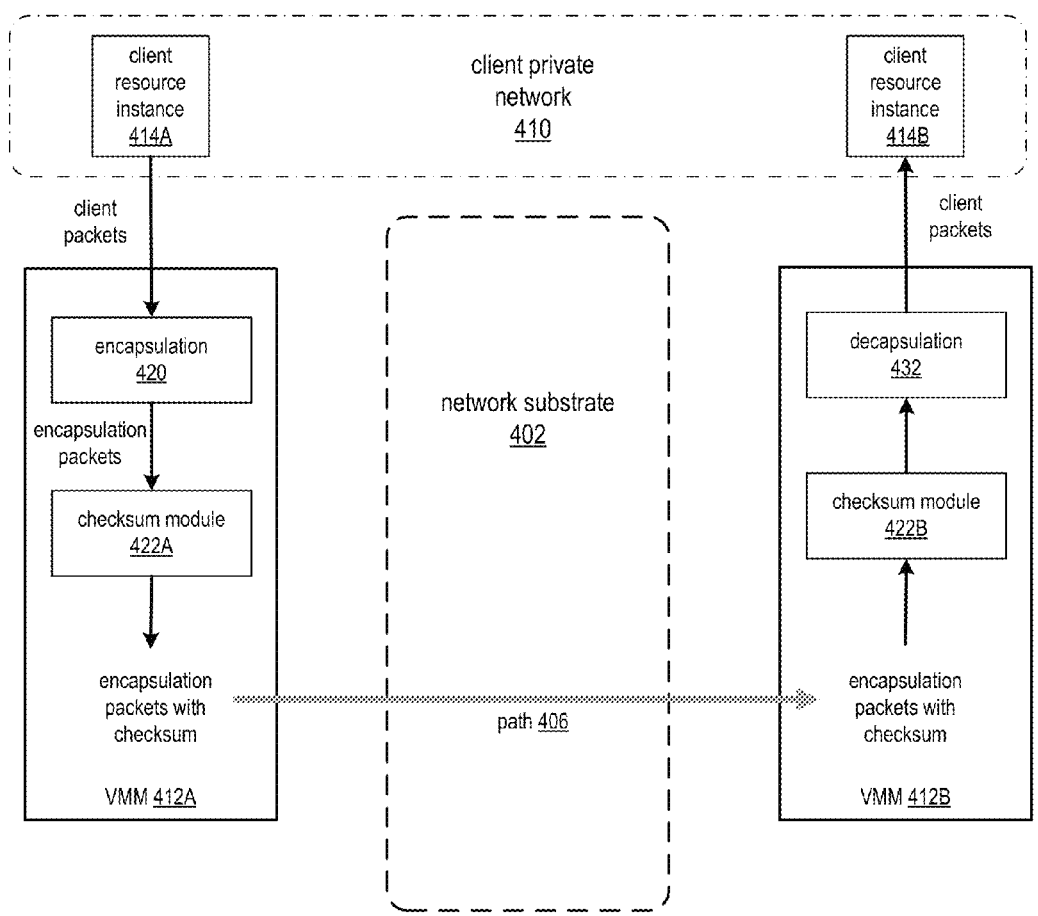
FIG. 4 illustrates implementing the methods and apparatus for checksumming encapsulation packets for a particular path or data flow between client resource instances in a client private network on a provider network, according to at least some embodiments.

FIG. 4 illustrates implementing the methods and apparatus for checksumming network packets encapsulated according to an encapsulation protocol for a particular path or data flow between client resource instances in an example client private network on an example provider network, according to at least some embodiments. In at least some implementations, a client may establish a private network 410 on a provider network, for example as illustrated in FIG. 3. Referring to FIG. 4, the private network 410 may include multiple client resource instances 414 implemented on VMs monitored by VMMs 412. For example, client resource instance 414A may be monitored by VMM 412A and client resource instance 414B may be monitored by VMM 412B.

Client resource instance 414A may send client data packets to client resource instance 414B. VMM 412A may receive the client data packets, and an encapsulation 420 module or function of VMM 412A may encapsulate the client data packets according to an encapsulation protocol. A checksum module 422A on VMM 412A may generate checksums for the encapsulation packets and write the checksum values to a checksum field in the encapsulation packet headers, for example as described in FIGS. 1A and 2A. The client resource instance may then send the encapsulation packets onto the network substrate 402. The encapsulation packets may be routed to VMM 412B according to information in the encapsulation packet header via a path 406 over the network substrate 402. In some implementations, in addition to the information used in routing and the checksum, the VMM 412A may include additional information (e.g., acknowledgement flags, timestamps, packet sequence numbers, etc.) in the encapsulation packet headers. See FIG. 5 for an example encapsulation packet, according to at least some embodiments.

Upon receiving the encapsulation packets via path 406, checksum module 422B on VMM 412 may validate the encapsulation packets according to the checksums in the encapsulation packet headers, for example as described in FIGS. 1A and 2A. A decapsulation 432 module or function of VMM 412B may then strip the encapsulation from the client data packets and forward the client data packets to client resource instance 414B.

Note that there may be one, two, or more separate data flows from client resource instance 414A to client resource instance 414B, each data flow corresponding to a communications session between a particular endpoint of resource instance 414A and a particular endpoint of resource instance 414B, and thus there may be one, two or more paths 406 between the two resource instances 414. Further note that client resource instances 414A and 414B may communicate according to stateful protocols such as Transmission Control Protocol (TCP), stateless protocols such as User Datagram Protocol (UDP), or both. Further note that client resource instances 414A and 414B may also communicate with other client resource instances in the client private network 410, and thus each resource instance may be associated with other paths over the network substrate 402.

Example Encapsulation Packet

Figure 5:
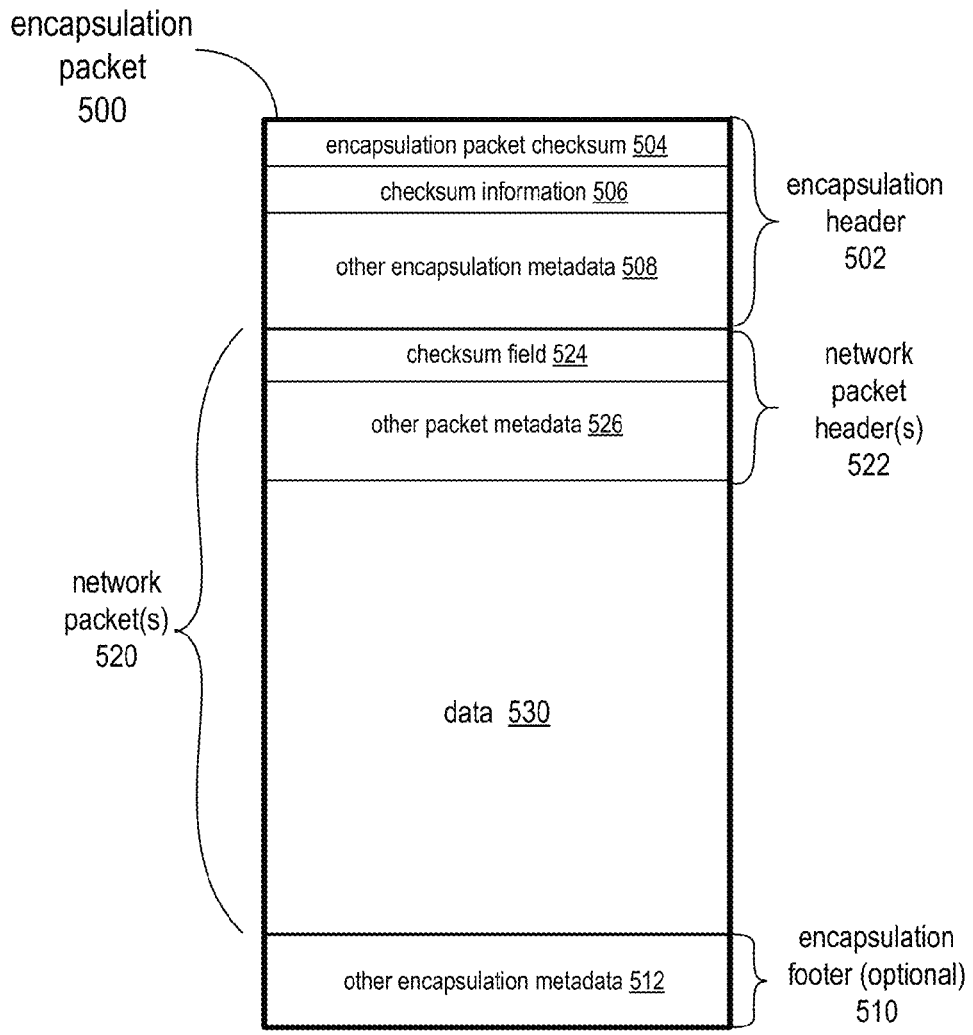
FIG. 5 shows an example encapsulation packet, according to at least some embodiments.

FIG. 5 shows an example encapsulation packet 500, according to at least some embodiments, and is not intended to be limiting. Encapsulation packet 500 may also be referred to as a network substrate packet. Encapsulation packet 500 may include one or more network packets 520 (e.g., IP, TCP, or UDP packets) encapsulated or tagged according to an encapsulation protocol by an encapsulation layer at on a source node, for example by a source VMM on a host system.

Each network packet 520 may include one or more network packet headers 522. As previously noted, a network packet 520 may include one, two, or more headers according to protocols used at the various protocol layers (e.g., Layer 3 and Layer 4 headers), each header including metadata for a protocol used at the respective layer. At least one of the network packet headers 522 includes a checksum field 524. Each network packet 520 may also, but does not necessarily, include client data 530.

The encapsulation protocol may include an encapsulation header 502. Note that the content of the header 502 and the ordering of elements in the header 502 are given by way of example, and are not intended to be limiting. The encapsulation header 502 may include encapsulation metadata 508 such as network address information that may, for example, be used to route the packet 500 over a network or network substrate to a destination (e.g., to a receiving or target VMM or to a network device such as an edge router). In some implementations, in addition to the information used in routing, encapsulation metadata 508 may include additional information (e.g., acknowledgement flags, timestamps, packet sequence numbers, etc.) The sender (e.g., a sending VMM) may fill in this metadata 508 when encapsulating the network packet(s) 520.

The encapsulation header 502 may also include at least one encapsulation packet checksum 504 field to which a checksum value or values, generated for the encapsulation packet 500 by a checksum module that implements an embodiment of the encapsulation protocol checksum method as described herein, may be written. Note that the checksum field 524 of the packet header(s) 522 of the encapsulated network packet(s) 520 may not be used. In at least some embodiments, the checksum 504 field in the header 502 may be a larger checksum field (e.g., a 32-bit field, 64-bit field, etc.) than the 16-bit field used in network protocols such as UDP and TCP, allowing other and more robust error detection and/or error correction technology to be used, such as CRC32 technology and erasure coding technology, than the error detection technology provided by standard network protocol checksum mechanisms. However, some embodiments may use a 16-bit checksum field. In addition, the encapsulation header 502 may also include other checksum information 506, such as an indication of whether or not checksumming has been performed and an indication of the checksumming algorithm that was used on the encapsulation packet(s) 500 at the source encapsulation layer.

The encapsulation protocol may, but does not necessarily, also include an encapsulation footer 510 that may include other encapsulation metadata 512. In some embodiments, the encapsulation packet checksum 504 field(s) and/or other checksum information 506 may be located in the footer 510 instead of or in addition to the header 504.

Selecting Checksum Algorithms

As previously mentioned, in at least some embodiments, the checksum algorithm that is used may be selected from among several checksum algorithms. FIGS. 6 and 7 illustrate embodiments in which a checksum algorithm is selected for a path or route over a network based on one or more criteria. For example, a checksum algorithm may be selected based on a determined level of confidence in the quality of the path or route over which the encapsulation packets are to be transmitted.

FIG. 6 is a high-level flowchart of an encapsulation protocol checksum method in which a checksum algorithm is selected from among several checksum algorithms based on one or more criteria, according to at least some embodiments. In FIG. 6, as in FIGS. 1A and 2A, network packets are being transmitted from a packet source on a network to a packet destination on the network via a network substrate. Note, however, that a similar method for selecting checksum algorithms may be applied when network packets are being sent from a packet source on a network to a packet destination on another network, for example as illustrated in FIGS. 1B and 2B.

Referring to FIG. 6, as indicated at 600, a packet source on a source node generates one or more network packets without performing a checksum operation on the packet(s), and thus without a checksum value in the checksum field of the network packet header(s). The generated network packet(s) are obtained by the source encapsulation layer on the source node. For example, the packet source may be a VM on a host system, and the source encapsulation layer may be implemented as or by a VMM on the host system, as illustrated in FIG. 3. The network packet(s) include metadata that indicates a packet destination for the packet(s), for example a VM on another host system.

As indicated at 602, the source encapsulation layer encapsulates the network packet(s) according to an encapsulation protocol to generate an encapsulation packet. See FIG. 5 for an example encapsulation packet that encapsulates one or more network packets and that includes an encapsulation header. The encapsulation header may include, but is not limited to, address and other information for routing the encapsulation packet to a destination (e.g., a VMM on another host system) via a path over the network substrate according to the encapsulation protocol.

As indicated at 604, a checksum algorithm is determined for the path via which the encapsulation packet is to be sent over the network substrate to the destination based on one or more criteria. In at least some embodiments, the source encapsulation layer on the source node determines the checksum algorithm to be used. However, in at least some embodiments, the source node may communicate or cooperate with the destination node to determine the checksum algorithm to be used.

In at least some embodiments, the checksum algorithm to be used may be selected from among several checksum algorithms, for example based on a determined level of confidence in the quality of the path or route over which the encapsulation packet is to be transmitted. For paths with higher confidence levels, less robust checksumming algorithms, or even no checksumming, may be used. For paths with lower confidence levels, more robust checksumming algorithms may be used. For some paths with low confidence levels, strong checksumming algorithms and/or algorithms that generate checksums that allow error correction may be used. In various embodiments, the confidence level in the path may be determined according to one or more of several techniques. The following lists some example techniques that may be used alone or in combination with other techniques to determine the confidence level in a path in embodiments, and is not intended to be limiting.

The confidence level may be based on physical location of the destination relative to the source. For example, if the destination is a VM located in the same rack as the source in a data center, a high confidence level may be assigned to the path. If the destination is a VM located in another rack than the rack in which the source is located in the data center, a lower but still relatively high confidence level may be assigned to the path. If the destination is a VM located in another data center, a lower confidence level may be assigned to the path. If the path to the destination goes over an intermediate network such as the Internet, a low confidence level may be assigned to the path.

The confidence level may be based on performance statistics for the paths or routes between sources and destinations on a network substrate. For example, one or more processes on a network substrate that routes encapsulation packets according to an encapsulation protocol may collect one or more performance metrics, for example dropped packet data and round-trip time data, for paths or routes on the network substrate, and may analyze the collected data to generate performance statistics for the paths. The performance statistics may be maintained in routing information for the network substrate. The source encapsulation layer may access the performance statistics for a path to the destination to determine the confidence level for the path.

The confidence level may be based on historical performance for the path between the source and destination maintained by the source. For example, the VMM on a host machine may record performance metrics, for example dropped packet information, for path to one or more destinations. The source encapsulation layer may access the historical performance information for a path to the destination to determine the confidence level for the path. For example, if the path has a history of many dropped packets, then a low confidence level may be assigned to the path. If the path seldom or never drops packets, then a high confidence level may be assigned to the path.

However, note that other techniques may be used to determine confidence levels in paths in some embodiments. In addition, in some embodiments, a combination of two or more techniques may be used to determine confidence levels in paths or routes between two endpoints.

Given the confidence level determined according to one or more of the above techniques, a checksum algorithm for the path to the destination may be determined. For example, one or more thresholds in confidence level may be specified. The following provides an example of selecting among several checksum algorithms according to specified thresholds according to a determined confidence level, and is not intended to be limiting:

At or above a high threshold—no checksumming is performed.

Between the high threshold and a middle threshold—a relatively weak (e.g., a 16-bit) error detecting checksum algorithm is selected that can detect some types of errors.

Between the middle threshold and a low threshold—a stronger (e.g., 32-bit) error detecting checksum algorithm such as a 32-bit cyclic redundancy code (CRC32) technology algorithm is selected that can detect more types of errors, but that typically does not provide error correction.

At or below the low threshold—an even stronger error detecting checksum algorithm or an algorithm that allows for error correction may be selected, for example an erasure coding technology algorithm or a Reed-Solomon technology algorithm.

Note that more or fewer levels (i.e., more or fewer thresholds) may be used in some embodiments. In addition, other checksum algorithms than the examples given may be used at the levels.

In at least some embodiments, other criteria may be considered alone or in combination with one or more transmission or path quality criteria in determining a checksum algorithm. These other criteria may include one or more of, but not limited to:

Support for the checksum algorithm on both the source and destination nodes or devices. For example, the source node may either communicate with the destination node or obtain configuration information about the destination node from elsewhere to determine if the destination node supports or implements a given checksum algorithm or algorithms. A checksum algorithm that both modes support may thus be selected.

Efficiency of the checksum algorithm implementation on the source and/or destination node. For example, a checksum algorithm may be selected for which checksum calculations can be offloaded to hardware on one or both nodes rather than being performed by standard CPU instructions.

Resource load on the source and/or destination node. For example, if CPU usage is determined to be relatively high on the source node and/or on the destination node, a more efficient (but potentially less robust) checksum algorithm may be selected.

As indicated at 606, the source encapsulation layer generates a checksum for the encapsulation packet according to the selected checksum algorithm. The checksum value is written to a checksum field in the encapsulation header of the encapsulation packet. See FIG. 5 for an example encapsulation packet with a checksum field in the encapsulation header. In addition, other information related to the checksum may be written to the encapsulation header, such as an indication of whether or not checksumming has been performed and an indication of the particular checksum algorithm that was used for the encapsulation packet at the source encapsulation layer.

As indicated at 608, the source encapsulation layer on the source node sends the encapsulation packet to the destination node. The encapsulation packet may be routed to the destination node via a path over the network substrate according to the routing information in the encapsulation header. At the destination node, the encapsulation packet may be received by a destination encapsulation layer. For example, the packet destination may be a VM on a host system (the destination node), and the destination encapsulation layer may be implemented as or by a VMM on the host system, as illustrated in FIG. 3.

As indicated at 610, after receiving the encapsulation packet, the destination encapsulation layer validates the encapsulation packet using the checksum value in the checksum field in the encapsulation header of the packet. In at least some embodiments, to validate the packet, the encapsulation layer generates a checksum value for the entire encapsulation packet (minus the checksum field) according to the checksum algorithm that was used at the source encapsulation layer to generate the checksum value in the encapsulation header, and compares the generated checksum value to the checksum value in the encapsulation header. If the two checksum values are the same, then it is highly probable that the encapsulation packet was not accidentally altered during transmission. If the two checksum values differ, then at least one error has been introduced into the encapsulation packet during transmission. A method for handling error(s) detected in encapsulation packets using checksumming is illustrated in FIG. 8, which is described later in this document. Note that, if the encapsulation header indicates that checksumming of the encapsulation packet was not performed, then at 610 the destination encapsulation layer does not validate the packet according to the checksum.

As indicated at 612, the destination encapsulation layer de-encapsulates the network packet(s) from the encapsulation packet. As indicated at 614, the destination encapsulation layer provides the network packet(s) to the packet destination. In at least some embodiments, the destination encapsulation layer informs the packet destination that checksum validation is not required for the network packet(s). For example, the packet destination may be a VM on a host system, and the encapsulation layer may be implemented as or by a VMM on the host system, as illustrated in FIG. 3.

In at least some embodiments, a checksum algorithm may be selected as described above for a first network packet in a packet flow between two endpoints (the source endpoint and the destination endpoint). After the algorithm is selected, it may be applied to subsequent network packets in the packet flow to the destination. However, in some embodiments, the source destination layer may change to a different checksum algorithm for the packet flow based on one or more criteria. For example, if resource usage on the source node and/or destination node changes, the source node may detect the change, select a different checksum algorithm based on the change, and switch to the different algorithm.

FIG. 7 is a high-level block diagram of a checksum technique in which a checksum algorithm is selected from among several checksum algorithms based on one or more criteria, according to at least some embodiments. A checksum module 720A at a source 710 receives a packet 714A. A checksum type determination 722 module applies one or more techniques, for example as described in relation to element 604 of FIG. 6, to determine a checksum algorithm 724 for the path 752 over a network substrate or intermediate network 750 on which the packet 714A is to be sent. In at least some embodiments, the checksum algorithm 724 may be selected from among several checksum algorithms 724A-724N according to one or more criteria as described above in reference to FIG. 6, for example based on a determined level of confidence in the quality of the path 752 over which the packet 714A is to be transmitted. In this example, checksum algorithm 724B is selected. The selected checksum algorithm 724B generates a checksum for the packet, and the generated checksum value is written to a checksum field in the header (or alternatively the footer) of the packet 714A to generate packet with checksum 724B. In addition, in at least some embodiments, an indication that checksum algorithm 724B was used is written to the header of the packet 724B. Packet with checksum 724B is then sent to destination 760 via the path 752 over network substrate or intermediate network 750. At destination 760, a checksum module 720B checks the packet header to determine which checksum algorithm 724 was used on the packet 724B and validates the packet 724B according to the indicated checksum algorithm (in this example, checksum algorithm 724B) to generate a validated packet 724C.

Handling Errors

FIG. 8 is a flowchart of a method for handling error(s) detected in encapsulation packets using checksumming, according to at least some embodiments. As indicated at 800, the destination encapsulation layer receives an encapsulation packet that includes one or more network packets. As indicated at 802, the destination encapsulation layer checks the encapsulation packet according to the checksum algorithm used to generate the checksum value in the encapsulation header. The checksum algorithm may be applied to generate a checksum value for the encapsulation packet; the generated checksum value is compared to the checksum value in the encapsulation header. At 804, if the checksum values are the same, then it is assumed that no errors have been introduced into the encapsulation packet during transmission and the method proceeds to element 812. At 804, if the checksum values are not the same, then the method goes to element 806.

At 806, if the checksum algorithm that was used to generate the checksum does not provide error correction or if error correction is not to be performed for some reason, then the method goes to element 816. As indicated at 816, in some embodiments a retransmission of the encapsulation packet may be requested. Alternatively, the encapsulation packet may be dropped, and another layer of the network stack may request retransmission.

At 806, if the checksum algorithm does provide error correction and error correction is to be performed, then an attempt to correct the error(s) according to the checksum may be made, as indicated at 808. At 810, if the error(s) were successfully corrected, then the method proceeds to element 812. Otherwise, the method goes to element 816, where a retransmission of the encapsulation packet may be requested, or alternatively the encapsulation packet may be dropped.

At 812, the destination encapsulation layer de-encapsulates the network packet(s) from the encapsulation packet and, at 814, provides the network packet to the packet destination.

Example Provider Network Environments

This section describes example provider network environments in which embodiments of the methods and apparatus for checksumming network packets encapsulated according to an encapsulation protocol may be implemented. However, these example provider network environments are not intended to be limiting.

Figure 9:
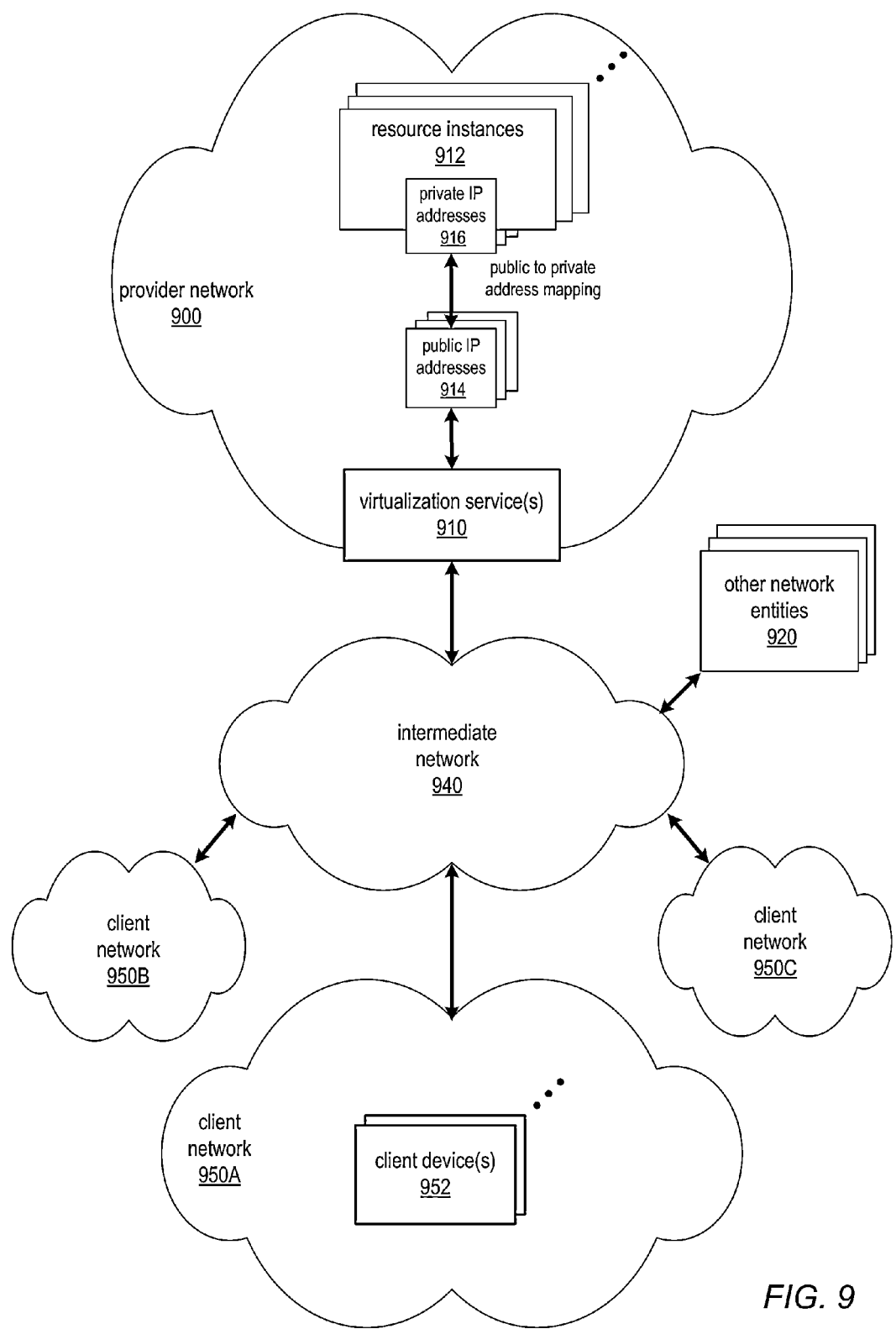
FIG. 9 illustrates an example provider network environment, according to at least some embodiments.

FIG. 9 illustrates an example provider network environment, according to at least some embodiments. A provider network 900 may provide resource virtualization to clients via one or more virtualization services 910 that allow clients to purchase, rent, or otherwise obtain instances 912 of virtualized resources, including but not limited to computation and storage resources, implemented on devices within the provider network or networks in one or more data centers. Private IP addresses 916 may be associated with the resource instances 912; the private IP addresses are the internal network addresses of the resource instances 912 on the provider network 900. In some embodiments, the provider network 900 may also provide public IP addresses 914 and/or public IP address ranges (e.g., Internet Protocol version 4 (IPv4) or Internet Protocol version 6 (IPv6) addresses) that clients may obtain from the provider 900.

Conventionally, the provider network 900, via the virtualization services 910, may allow a client of the service provider (e.g., a client that operates client network 950A) to dynamically associate at least some public IP addresses 914 assigned or allocated to the client with particular resource instances 912 assigned to the client. The provider network 900 may also allow the client to remap a public IP address 914, previously mapped to one virtualized computing resource instance 912 allocated to the client, to another virtualized computing resource instance 912 that is also allocated to the client. Using the virtualized computing resource instances 912 and public IP addresses 914 provided by the service provider, a client of the service provider such as the operator of client network 950A may, for example, implement client-specific applications and present the client's applications on an intermediate network 940, such as the Internet. Other network entities 920 on the intermediate network 940 may then generate traffic to a destination public IP address 914 published by the client network 950A; the traffic is routed to the service provider data center, and at the data center is routed, via a network substrate, to the private IP address 916 of the virtualized computing resource instance 912 currently mapped to the destination public IP address 914. Similarly, response traffic from the virtualized computing resource instance 912 may be routed via the network substrate back onto the intermediate network 940 to the source entity 920.

Private IP addresses, as used herein, refer to the internal network addresses of resource instances in a provider network. Private IP addresses are only routable within the provider network. Network traffic originating outside the provider network is not directly routed to private IP addresses; instead, the traffic uses public IP addresses that are mapped to the resource instances. The provider network may include network devices or appliances that provide network address translation (NAT) or similar functionality to perform the mapping from public IP addresses to private IP addresses and vice versa.

Public IP addresses, as used herein, are Internet routable network addresses that are assigned to resource instances, either by the service provider or by the client. Traffic routed to a public IP address is translated, for example via 1:1 network address translation (NAT), and forwarded to the respective private IP address of a resource instance.

Some public IP addresses may be assigned by the provider network infrastructure to particular resource instances; these public IP addresses may be referred to as standard public IP addresses, or simply standard IP addresses. In at least some embodiments, a standard IP address is mapped to a private IP address of a resource instance as the default configuration for all resource instance types.

At least some public IP addresses may be allocated to or obtained by clients of the provider network 900; a client may then assign their allocated public IP addresses to particular resource instances allocated to the client. These public IP addresses may be referred to as client public IP addresses, or simply client IP addresses. Instead of being assigned by the provider network 900 to resource instances as in the case of standard IP addresses, client IP addresses may be assigned to resource instances by the clients, for example via an API provided by the service provider. Unlike standard IP addresses, client IP Addresses are allocated to client accounts and can be remapped to other resource instances by the respective clients as necessary or desired. A client IP address is associated with a client's account, not a particular resource instance, and the client controls that IP address until the client chooses to release it. Unlike conventional static IP addresses, client IP addresses allow the client to mask resource instance or availability zone failures by remapping the client's public IP addresses to any resource instance associated with the client's account. The client IP addresses, for example, enable a client to engineer around problems with the client's resource instances or software by remapping client IP addresses to replacement resource instances.

Figure 10:
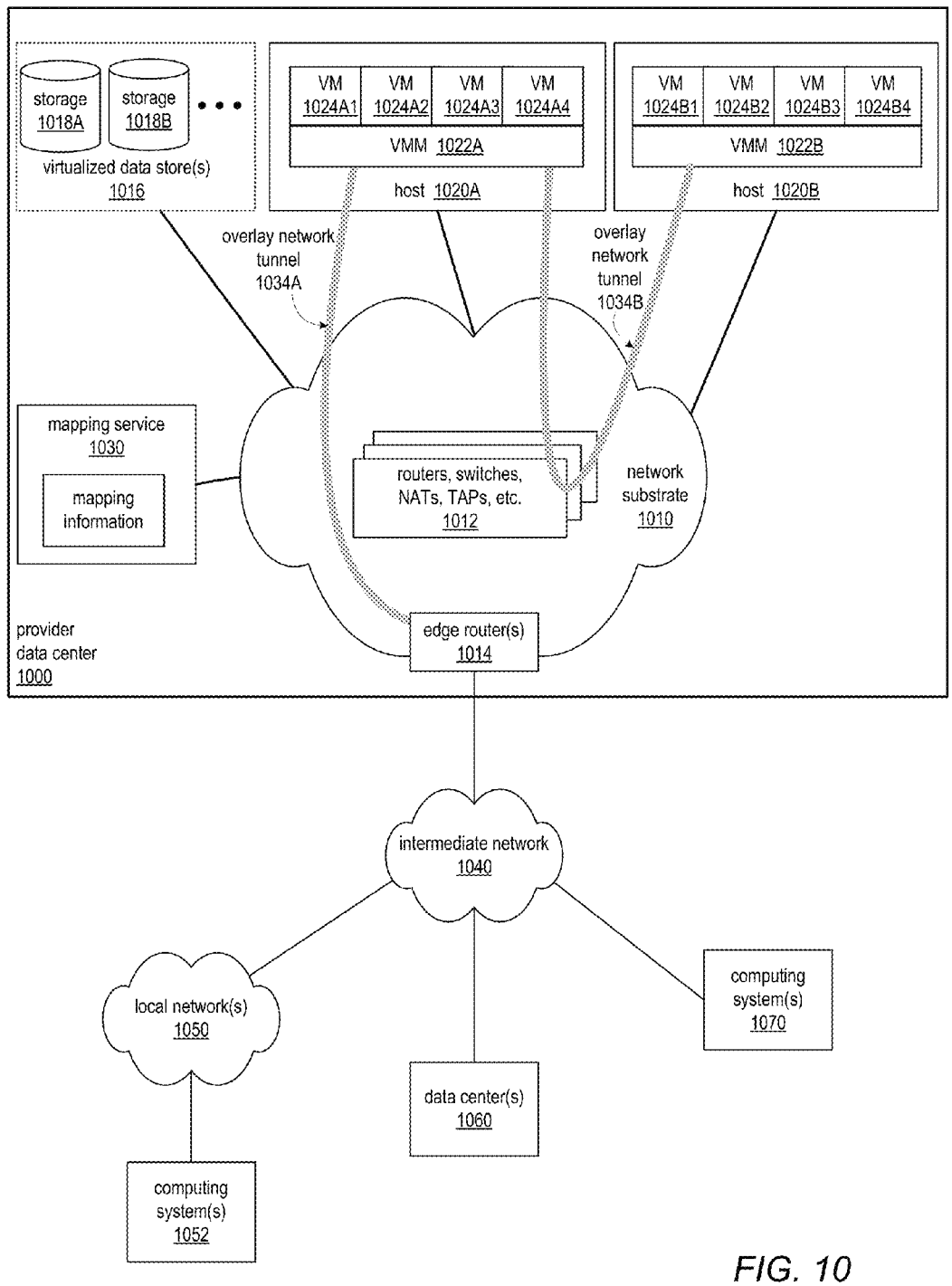
FIG. 10 illustrates an example data center that implements an overlay network on a network substrate using encapsulation protocol technology, according to some embodiments.

FIG. 10 illustrates an example data center that implements an overlay network on a network substrate using IP tunneling technology, according to at least some embodiments. A provider data center 1000 may include a network substrate that includes networking devices 1012 such as routers, switches, network address translators (NATs), and so on. At least some embodiments may employ an Internet Protocol (IP) tunneling technology to provide an overlay network via which encapsulation packets may be passed through network substrate 1010 using tunnels. The IP tunneling technology may provide a mapping and encapsulating system for creating an overlay network on a network (e.g., a local network in data center 1000 of FIG. 10) and may provide a separate namespace for the overlay layer (the public IP addresses) and the network substrate 1010 layer (the private IP addresses). Packets in the overlay layer may be checked against a mapping directory (e.g., provided by mapping service 1030) to determine what their tunnel substrate target (private IP address) should be. The IP tunneling technology provides a virtual network topology (the overlay network); the interfaces (e.g., service APIs) that are presented to clients are attached to the overlay network so that when a client provides a network address to which the client wants to send packets, the IP address is run in virtual space by communicating with a mapping service (e.g., mapping service 1030) that knows where the IP overlay addresses are.

In at least some embodiments, the IP tunneling technology may map IP overlay addresses (public IP addresses) to substrate IP addresses (private IP addresses), encapsulate the packets in a tunnel between the two namespaces, and deliver the packet to the correct endpoint via the tunnel, where the encapsulation is stripped from the packet. In FIG. 10, an example overlay network tunnel 1034A from a virtual machine (VM) 1024A on host 1020A to a device on the intermediate network 1050 and an example overlay network tunnel 1034B between a VM 1024B on host 1020B and a VM 1024C on host 1020C are shown. In some embodiments, a packet may be encapsulated in an overlay network packet format before sending, and the overlay network packet may be stripped after receiving. In other embodiments, instead of encapsulating packets in overlay network packets, an overlay network address (public IP address) may be embedded in a substrate address (private IP address) of a packet before sending, and stripped from the packet address upon receiving. As an example, the overlay network may be implemented using 32-bit IPv4 (Internet Protocol version 4) addresses as the public IP addresses, and the IPv4 addresses may be embedded as part of 128-bit IPv6 (Internet Protocol version 6) addresses used on the substrate network as the private IP addresses.

Referring to FIG. 10, at least some networks in which embodiments may be implemented may include hardware virtualization technology that enables multiple operating systems to run concurrently on a host computer (e.g., hosts 1020A and 1020B of FIG. 10), i.e. as virtual machines (VMs) 1024 on the hosts 1020. The VMs 1024 may, for example, be rented or leased to clients of a network provider. A hypervisor, or virtual machine monitor (VMM) 1022, on a host 1020 presents the VMs 1024 on the host with a virtual platform and monitors the execution of the VMs 1024. Each VM 1024 may be provided with one or more private IP addresses; the VMM 1022 on a host 1020 may be aware of the private IP addresses of the VMs 1024 on the host. A mapping service 1030 may be aware of all network IP prefixes and the IP addresses of routers or other devices serving IP addresses on the local network. This includes the IP addresses of the VMMs 1022 serving multiple VMs 1024. The mapping service 1030 may be centralized, for example on a server system, or alternatively may be distributed among two or more server systems or other devices on the network. A network may, for example, use the mapping service technology and IP tunneling technology to, for example, route data packets between VMs 1024 on different hosts 1020 within the data center 1000 network; note that an interior gateway protocol (IGP) may be used to exchange routing information within such a local network.

In addition, a network such as the provider data center 1000 network (which is sometimes referred to as an autonomous system (AS)) may use the mapping service technology, IP tunneling technology, and routing service technology to route packets from the VMs 1024 to Internet destinations, and from Internet sources to the VMs 1024. Note that an external gateway protocol (EGP) or border gateway protocol (BGP) is typically used for Internet routing between sources and destinations on the Internet. FIG. 10 shows an example provider data center 1000 implementing a network that provides resource virtualization technology and that provides full Internet access via edge router(s) 1014 that connect to Internet transit providers, according to at least some embodiments. The provider data center 1000 may, for example, provide clients the ability to implement virtual computing systems (VMs 1024) via a hardware virtualization service and the ability to implement virtualized data stores 1016 on storage resources 1018 via a storage virtualization service.

The data center 1000 network may implement IP tunneling technology, mapping service technology, and a routing service technology to route traffic to and from virtualized resources, for example to route packets from the VMs 1024 on hosts 1020 in data center 1000 to Internet destinations, and from Internet sources to the VMs 1024. Internet sources and destinations may, for example, include computing systems 1070 connected to the intermediate network 1040 and computing systems 1052 connected to local networks 1050 that connect to the intermediate network 1040 (e.g., via edge router(s) 1014 that connect the network 1050 to Internet transit providers). The provider data center 1000 network may also route packets between resources in data center 1000, for example from a VM 1024 on a host 1020 in data center 1000 to other VMs 1024 on the same host or on other hosts 1020 in data center 1000.

A service provider that provides data center 1000 may also provide additional data center(s) 1060 that include hardware virtualization technology similar to data center 1000 and that may also be connected to intermediate network 1040. Packets may be forwarded from data center 1000 to other data centers 1060, for example from a VM 1024 on a host 1020 in data center 1000 to another VM on another host in another, similar data center 1060, and vice versa.

While the above describes hardware virtualization technology that enables multiple operating systems to run concurrently on host computers as virtual machines (VMs) on the hosts, where the VMs may be rented or leased to clients of the network provider, the hardware virtualization technology may also be used to provide other computing resources, for example storage resources 1018, as virtualized resources to clients of a network provider in a similar manner.

Figure 11:
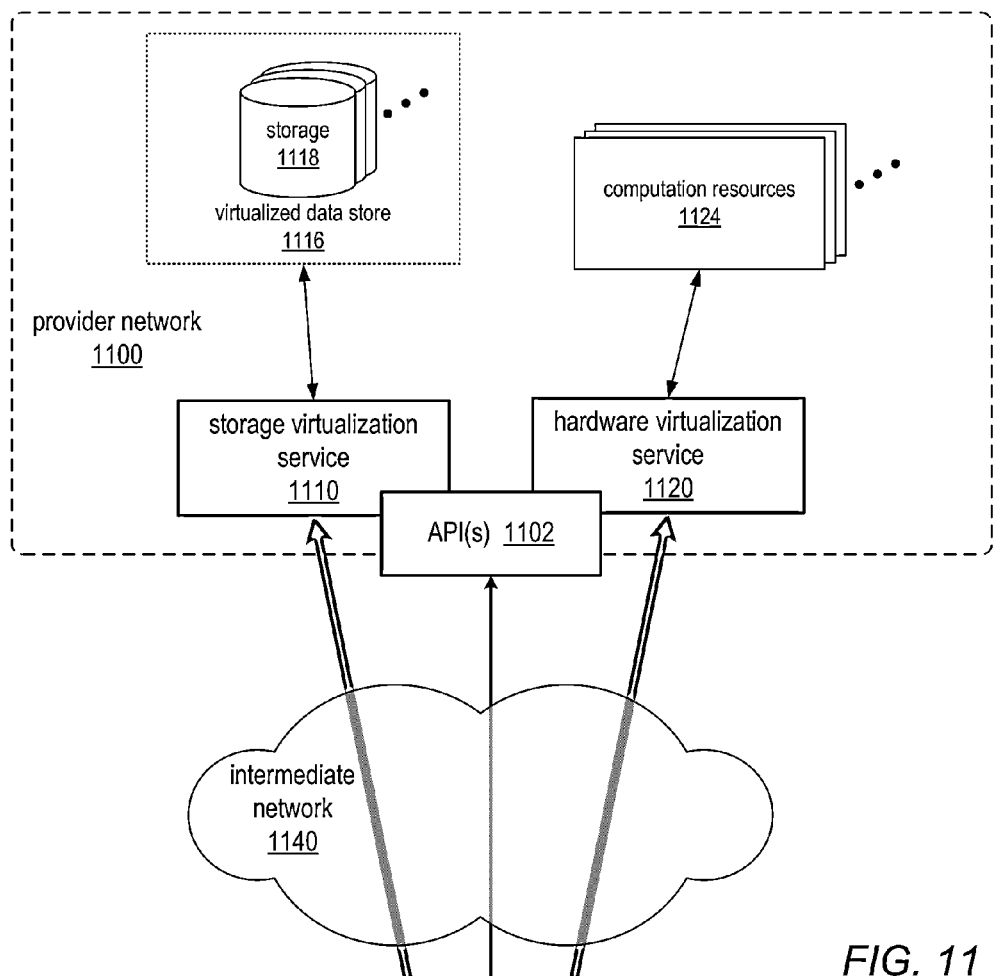
FIG. 11 is a block diagram of an example provider network that provides a storage virtualization service and a hardware virtualization service to clients, according to at least some embodiments.
Figure 11:
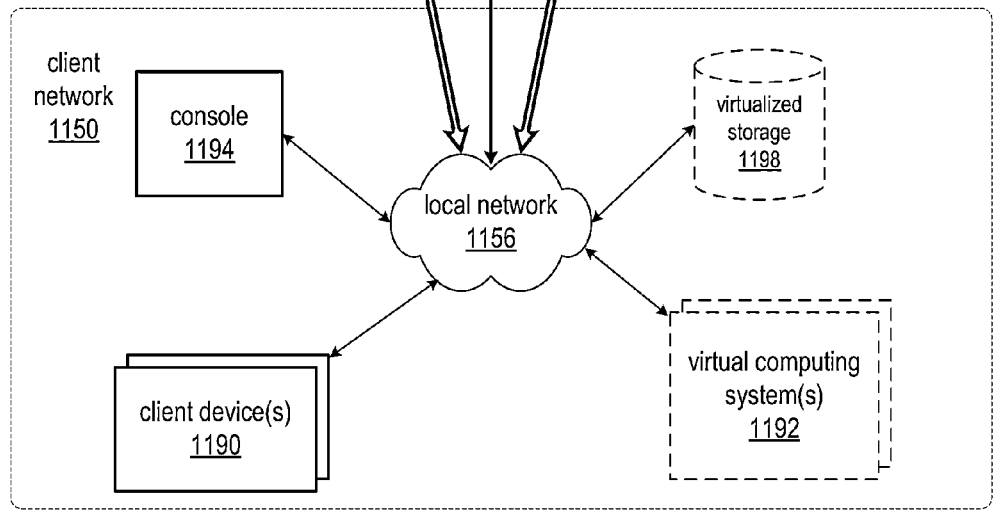
Figure 12:
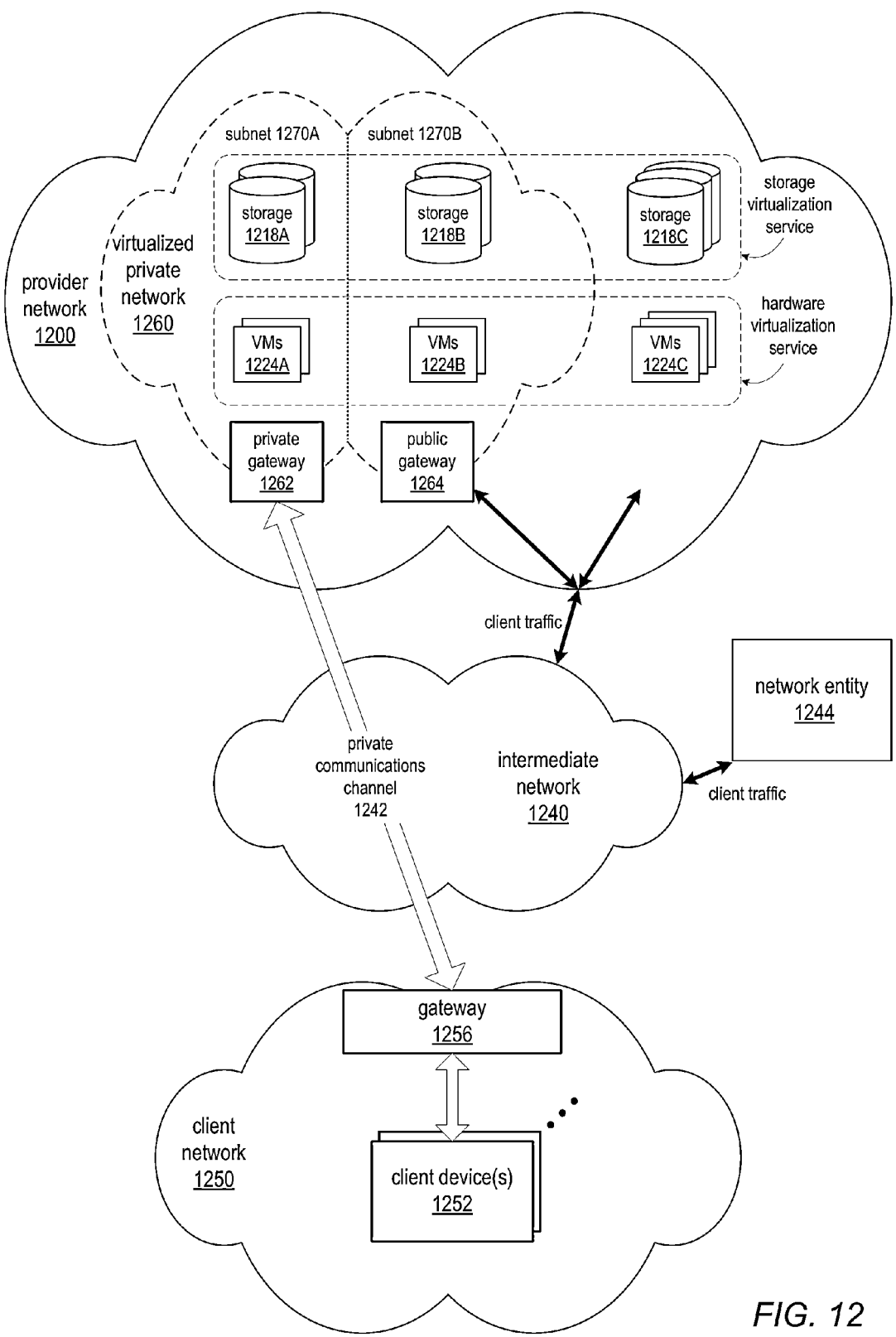
FIG. 12 illustrates an example provider network that provides virtualized private networks to at least some clients, according to at least some embodiments.

FIG. 11 is a block diagram of an example provider network that provides a storage virtualization service and a hardware virtualization service to clients, according to at least some embodiments. Hardware virtualization service 1120 provides multiple computation resources 1124 (e.g., VMs) to clients. The computation resources 1124 may, for example, be rented or leased to clients of the provider network 1100 (e.g., to a client that implements client network 1150). Each computation resource 1124 may be provided with one or more private IP addresses. Provider network 1100 may be configured to route packets from the private IP addresses of the computation resources 1124 to public Internet destinations, and from public Internet sources to the computation resources 1124.

Provider network 1100 may provide a client network 1150, for example coupled to intermediate network 1140 via local network 1156, the ability to implement virtual computing systems 1192 via hardware virtualization service 1120 coupled to intermediate network 1140 and to provider network 1100. In some embodiments, hardware virtualization service 1120 may provide one or more APIs 1102, for example a web services interface, via which a client network 1150 may access functionality provided by the hardware virtualization service 1120, for example via a console 1194. In at least some embodiments, at the provider network 1100, each virtual computing system 1192 at client network 1150 may correspond to a computation resource 1124 that is leased, rented, or otherwise provided to client network 1150.

From an instance of a virtual computing system 1192 and/or another client device 1190 or console 1194, the client may access the functionality of storage virtualization service 1110, for example via one or more APIs 1102, to access data from and store data to a virtual data store 1116 provided by the provider network 1100. In some embodiments, a virtualized data store gateway (not shown) may be provided at the client network 1150 that may locally cache at least some data, for example frequently accessed or critical data, and that may communicate with virtualized data store service 1110 via one or more communications channels to upload new or modified data from a local cache so that the primary store of data (virtualized data store 1116) is maintained. In at least some embodiments, a user, via a virtual computing system 1192 and/or on another client device 1190, may mount and access virtual data store 1116 volumes, which appear to the user as local virtualized storage 1198.

While not shown in FIG. 11, the virtualization service(s) may also be accessed from resource instances within the provider network 1100 via API(s) 1102. For example, a client, appliance service provider, or other entity may access a virtualization service from within a respective private network on the provider network 1100 via an API 1102 to request allocation of one or more resource instances within the private network or within another private network.

FIG. 12 illustrates an example provider network that provides private networks on the provider network to at least some clients, according to at least some embodiments. A client's virtualized private network 1260 on a provider network 1200, for example, enables a client to connect their existing infrastructure (e.g., devices 1252) on client network 1250 to a set of logically isolated resource instances (e.g., VMs 1224A and 1224B and storage 1218A and 1218B), and to extend management capabilities such as security services, firewalls, and intrusion detection systems to include their resource instances.

A client's virtualized private network 1260 may be connected to a client network 1250 via a private communications channel 1242. A private communications channel 1242 may, for example, be a tunnel implemented according to an encapsulation protocol technology or some other peering connection over an intermediate network 1240. The intermediate network may, for example, be a shared network or a public network such as the Internet. Alternatively, a private communications channel 1242 may be implemented over a direct, dedicated connection between virtualized private network 1260 and client network 1250.

A public network may be broadly defined as a network that provides open access to and interconnectivity among a plurality of entities. The Internet, or World Wide Web (WWW) is an example of a public network. A shared network may be broadly defined as a network to which access is limited to two or more entities, in contrast to a public network to which access is not generally limited. A shared network may, for example, include one or more local area networks (LANs) and/or data center networks, or two or more LANs or data center networks that are interconnected to form a wide area network (WAN). Examples of shared networks may include, but are not limited to, corporate networks and other enterprise networks. A shared network may be anywhere in scope from a network that covers a local area to a global network. Note that a shared network may share at least some network infrastructure with a public network, and that a shared network may be coupled to one or more other networks, which may include a public network, with controlled access between the other network(s) and the shared network. A shared network may also be viewed as a private network, in contrast to a public network such as the Internet. In embodiments, either a shared network or a public network may serve as an intermediate network between a provider network and a client network.

To establish a virtualized private network 1260 for a client on provider network 1200, one or more resource instances (e.g., VMs 1224A and 1224B and storage 1218A and 1218B) may be allocated to the virtualized private network 1260. Note that other resource instances (e.g., storage 1218C and VMs 1224C) may remain available on the provider network 1200 for other client usage. A range of public IP addresses may also be allocated to the virtualized private network 1260. In addition, one or more networking devices (routers, switches, etc.) of the provider network 1200 may be allocated to the virtualized private network 1260. A private communications channel 1242 may be established between a private gateway 1262 at virtualized private network 1260 and a gateway 1256 at client network 1250.

In at least some embodiments, in addition to, or instead of, a private gateway 1262, virtualized private network 1260 may include a public gateway 1264 that enables resources within virtualized private network 1260 to communicate directly with entities (e.g., network entity 1244) via intermediate network 1240, and vice versa, instead of or in addition to via private communications channel 1242.

Virtualized private network 1260 may be, but is not necessarily, subdivided into two or more subnets 1270. For example, in implementations that include both a private gateway 1262 and a public gateway 1264, the private network may be subdivided into a subnet 1270A that includes resources (VMs 1224A and storage 1218A, in this example) reachable through private gateway 1262, and a subnet 1270B that includes resources (VMs 1224B and storage 1218B, in this example) reachable through public gateway 1264.

The client may assign particular client public IP addresses to particular resource instances in virtualized private network 1260. A network entity 1244 on intermediate network 1240 may then send traffic to a public IP address published by the client; the traffic is routed, by the provider network 1200, to the associated resource instance. Return traffic from the resource instance is routed, by the provider network 1200, back to the network entity 1244 over intermediate network 1240. Note that routing traffic between a resource instance and a network entity 1244 may require network address translation to translate between the public IP address and the private IP address of the resource instance.

At least some embodiments may allow a client to remap public IP addresses in a client's virtualized private network 1260 as illustrated in FIG. 12 to devices on the client's external network 1250. When a packet is received (e.g., from network entity 1244), the network 1200 may determine that the destination IP address indicated by the packet has been remapped to an endpoint on external network 1250 and handle routing of the packet to the respective endpoint, either via private communications channel 1242 or via the intermediate network 1240. Response traffic may be routed from the endpoint to the network entity 1244 through the provider network 1200, or alternatively may be directly routed to the network entity 1244 by the client network 1250. From the perspective of the network entity 1244, it appears as if the network entity 1244 is communicating with the public IP address of the client on the provider network 1200. However, the network entity 1244 has actually communicated with the endpoint on client network 1250.

While FIG. 12 shows network entity 1244 on intermediate network 1240 and external to provider network 1200, a network entity may be an entity on provider network 1200. For example, one of the resource instances provided by provider network 1200 may be a network entity that sends traffic to a public IP address published by the client.

Illustrative System

In at least some embodiments, a server that implements a portion or all of the methods and apparatus for checksumming network packets encapsulated according to an encapsulation protocol as described herein may include a general-purpose computer system that includes or is configured to access one or more computer-accessible media, such as computer system 2000 illustrated in FIG. 13. In the illustrated embodiment, computer system 2000 includes one or more processors 2010 coupled to a system memory 2020 via an input/output (I/O) interface 2030. Computer system 2000 further includes a network interface 2040 coupled to I/O interface 2030.

In various embodiments, computer system 2000 may be a uniprocessor system including one processor 2010, or a multiprocessor system including several processors 2010 (e.g., two, four, eight, or another suitable number). Processors 2010 may be any suitable processors capable of executing instructions. For example, in various embodiments, processors 2010 may be general-purpose or embedded processors implementing any of a variety of instruction set architectures (ISAs), such as the x86, PowerPC, SPARC, or MIPS ISAs, or any other suitable ISA. In multiprocessor systems, each of processors 2010 may commonly, but not necessarily, implement the same ISA.

System memory 2020 may be configured to store instructions and data accessible by processor(s) 2010. In various embodiments, system memory 2020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as those methods, techniques, and data described above for the methods and apparatus for checksumming network packets encapsulated according to an encapsulation protocol, are shown stored within system memory 2020 as code 2025 and data 2026.

In one embodiment, I/O interface 2030 may be configured to coordinate I/O traffic between processor 2010, system memory 2020, and any peripheral devices in the device, including network interface 2040 or other peripheral interfaces. In some embodiments, I/O interface 2030 may perform any necessary protocol, timing or other data transformations to convert data signals from one component (e.g., system memory 2020) into a format suitable for use by another component (e.g., processor 2010). In some embodiments, I/O interface 2030 may include support for devices attached through various types of peripheral buses, such as a variant of the Peripheral Component Interconnect (PCI) bus standard or the Universal Serial Bus (USB) standard, for example. In some embodiments, the function of I/O interface 2030 may be split into two or more separate components, such as a north bridge and a south bridge, for example. Also, in some embodiments some or all of the functionality of I/O interface 2030, such as an interface to system memory 2020, may be incorporated directly into processor 2010.

Network interface 2040 may be configured to allow data to be exchanged between computer system 2000 and other devices 2060 attached to a network or networks 2050, such as other computer systems or devices as illustrated in FIGS. 1 through 12, for example. In various embodiments, network interface 2040 may support communication via any suitable wired or wireless general data networks, such as types of Ethernet network, for example. Additionally, network interface 2040 may support communication via telecommunications/telephony networks such as analog voice networks or digital fiber communications networks, via storage area networks such as Fibre Channel SANs, or via any other suitable type of network and/or protocol.

In some embodiments, system memory 2020 may be one embodiment of a computer-accessible medium configured to store program instructions and data as described above for FIGS. 1 through 12 for implementing embodiments of a method for checksumming network packets encapsulated according to an encapsulation protocol. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 2000 via I/O interface 2030. A non-transitory computer-accessible storage medium may also include any volatile or non-volatile media such as RAM (e.g. SDRAM, DDR SDRAM, RDRAM, SRAM, etc.), ROM, etc, that may be included in some embodiments of computer system 2000 as system memory 2020 or another type of memory. Further, a computer-accessible medium may include transmission media or signals such as electrical, electromagnetic, or digital signals, conveyed via a communication medium such as a network and/or a wireless link, such as may be implemented via network interface 2040.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc, as well as transmission media or signals such as electrical, electromagnetic, or digital signals, conveyed via a communication medium such as network and/or a wireless link.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended to embrace all such modifications and changes and, accordingly, the above description to be regarded in an illustrative rather than a restrictive sense.

What is claimed is:

1. A provider network, comprising;
   a network substrate; and
   a plurality of host devices coupled to the network substrate, wherein each host device includes a plurality of virtual machines (VMs) and a virtual machine monitor (VMM) that monitors the plurality of VMs on the respective host device, wherein each VMM is configured to:
   obtain one or more Internet Protocol (IP) packets generated by a source VM on the respective host device, wherein the one or more IP packets are not checksummed by the source VM;
   encapsulate the one or more IP packets according to an encapsulation protocol to generate a network substrate packet that includes the one or more IP packets as a payload, wherein the network substrate packet includes network substrate packet metadata;
   generate a checksum of at least the payload of the network substrate packet according to a checksum algorithm;
   write the generated checksum to a checksum field of the network substrate packet metadata; and
   send the network substrate packet to a destination on the provider network over the network substrate.

2. The provider network as recited in claim 1, wherein the one or more IP packets are for a target VM on one of the plurality of host devices, wherein the destination is the VMM that monitors the target VM, and wherein the destination VMM is configured to:
   receive the network substrate packet via the network substrate;
   generate a checksum value for at least the payload of the network substrate packet according to the checksum algorithm that was used to generate the checksum in the checksum field of the network substrate packet metadata;
   compare the generated checksum value to the checksum in the checksum field of the network substrate packet metadata to validate the received network substrate packet;
   de-encapsulate the one or more IP packets from the network substrate packet;
   provide the one or more IP packets to the target VM; and
   inform the target VM that checksumming of the one or more IP packets is not required.

3. The provider network as recited in claim 1, wherein the one or more IP packets are for a target device on another network, wherein the destination is a network device that couples the network substrate to the other network, and wherein the network device is configured to:
   receive the network substrate packet via the network substrate;
   validate the received network substrate packet according to the checksum in the checksum field of the network substrate packet metadata;
   de-encapsulate the one or more IP packets from the network substrate packet; and
   for each of the one or more IP packets:
     generate at least one checksum for the IP packet;
     write the at least one checksum for the IP packet to the IP packet; and
     send the IP packet to the target device over the other network.

4. The provider network as recited in claim 1, wherein, to generate a checksum of at least the payload of the network substrate packet according to a checksum algorithm, each VMM is configured to offload at least a portion of checksum calculation to hardware on the respective host system.

5. The provider network as recited in claim 1, wherein each VMM is further configured to select an algorithm used to generate the checksum from among a plurality of algorithms based on one or more criteria, wherein at least one of the plurality of algorithms provides error correction or error detection capability, and wherein the one or more criteria include one or more of quality of a path over the network substrate to the destination, support for the algorithm on the VMM and the destination, efficiency of the algorithm on the VMM, or resource load on the VMM.

6. The provider network as recited in claim 1, wherein each of the one or more IP packets comprises one of a Transmission Control Protocol (TCP) packet or a User Datagram Protocol (UDP) packet.

7. The provider network as recited in claim 1, wherein at least a subset of the VMs on the plurality of host devices are each assigned to one of a plurality of clients of the provider network as a client resource instance, and wherein at least two of the VMs on at least one host device are assigned to different ones of the plurality of clients.

8. A method, comprising:
performing, by an encapsulation layer on a computing device:
obtaining one or more network packets generated by a packet source on the computing device, wherein each of the one or more network packets includes at least one checksum field that is not filled by the packet source;
tagging the one or more network packets with encapsulation metadata for routing the one or more network packets over a first network to a destination device to generate an encapsulated packet;
generating a checksum value for at least the one or more network packets in the encapsulated packet according to a checksum algorithm;
writing the checksum value to the encapsulated packet as additional encapsulation metadata; and
sending the encapsulated packet to the destination device over the first network according to the encapsulation metadata.

9. The method as recited in claim 8, wherein the destination device is another computing device on the first network, the method further comprising performing, by an encapsulation layer on the destination device:
receiving the encapsulated packet;
validating the received encapsulated packet according to the checksum in the encapsulation metadata;
removing the encapsulation metadata from the one or more network packets;
providing the one or more network packets to a packet destination on the destination computing device; and
informing the packet destination that checksumming the one or more network packets is not required.

10. The method as recited in claim 8, wherein the one or more network packets are generated by the packet source according to a network protocol that requires the at least one checksum field in each of the one or more network packets to be filled to be compliant with standards of the network protocol.

11. The method as recited in claim 8, wherein the one or more network packets are for a target device on a second network, wherein the destination device is a network device on the first network that couples the first network to the second network, and wherein the method further comprises performing, by the network device:
receiving the encapsulated packet;
removing the encapsulation metadata from the one or more network packets; and
for each of the one or more network packets:
generating at least one checksum value for the network packet;
writing the at least one checksum value for the network packet to the network packet; and
sending the network packet to the target device over the second network.

12. The method as recited in claim 11, further comprising validating the received encapsulated packet according to the checksum value in the encapsulation metadata prior to said removing the encapsulation metadata from the network packet.

13. The method as recited in claim 8, further comprising selecting an algorithm used to generate the checksum from among a plurality of algorithms based on one or more of quality of a path over the network substrate to the destination, support for the algorithm on the VMM and the destination, efficiency of the algorithm on the VMM, or resource load on the VMM.

14. The method as recited in claim 13, wherein at least one of the plurality of algorithms provides error correction or error detection capability.

15. The method as recited in claim 8, wherein said generating a checksum value for at least the one or more network packets in the encapsulated packet according to a checksum algorithm comprises offloading at least a portion of checksum calculation to hardware on the computing device.

16. The method as recited in claim 8, wherein the computing device is one of a plurality of host devices coupled to the first network, wherein each of the plurality of host devices includes a plurality of virtual machines (VMs) and a virtual machine monitor (VMM) that monitors the plurality of VMs on the respective host device, wherein the packet source is one of the plurality of VMs on the computing device, wherein the encapsulation layer is implemented by the VMM on the computing device, wherein at least a subset of the VMs on the plurality of host devices are each assigned to one of a plurality of clients of a service provider as a client resource instance, and wherein at least two of the VMs on at least one host device are assigned to different ones of the plurality of clients of the service provider.

17. A non-transitory computer-accessible storage medium storing program instructions computer-executable to implement:
obtaining one or more network packets generated by a packet source, wherein the network packet is not checksummed;
encapsulating the one or more network packets according to an encapsulation protocol to generate an encapsulated packet, wherein the encapsulated protocol includes metadata that specifies routing information for routing the encapsulated packet over a first network to a destination on the first network;
selecting an algorithm for generating a checksum for the encapsulated packet from among a plurality of algorithms based on one or more selection criteria;
generating a checksum for at least the one or more network packets in the encapsulated packet according to the selected algorithm;
writing the checksum to a checksum field of the encapsulation protocol in the encapsulated packet; and
sending the encapsulated packet to the destination over the first network according to the routing information specified in the encapsulation metadata.

18. The non-transitory computer-accessible storage medium as recited in claim 17, wherein the one or more selection criteria include one or more of a determined level of confidence in quality of a path over the first network via which the encapsulated packet is to be routed to the destination, support for the algorithm, efficiency of the algorithm, or resource load.

19. The non-transitory computer-accessible storage medium as recited in claim 17, wherein the program instructions are further computer-executable to implement:

receiving an encapsulated packet via the network, wherein the received encapsulated packet includes at least one network packet for a packet destination;

validating the received encapsulated packet according to a checksum value for the encapsulated packet in the encapsulation header of the received encapsulated packet;

decapsulating the at least one network packet from the encapsulated packet;

providing the at least one network packet to the packet destination; and informing the packet destination that checksumming of the at least one network packet is not required.

20. The non-transitory computer-accessible storage medium as recited in claim 17, wherein the program instructions are further computer-executable to implement:

receiving an encapsulated packet via the network, wherein the received encapsulated packet includes at least one network packet for a packet destination on a second network;

decapsulating the at least one network packet from the encapsulated packet;

for each of the at least one network packet:
   generating at least one checksum for the network packet;
   writing the at least one checksum for the network packet to the network packet; and
   sending the network packet to the packet destination over the second network.

\* \* \* \* \*